United States Patent
Shin et al.

(10) Patent No.: US 8,610,218 B2
(45) Date of Patent: Dec. 17, 2013

(54) SEMICONDUCTOR DEVICE HAVING A STABLE RESISTOR AND METHODS OF FORMING THE SAME

(75) Inventors: Jinhyun Shin, Suwon-si (KR); Minchul Kim, Hwaseong-si (KR); Seong Soon Cho, Suwon-si (KR); Seungwook Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/412,700

(22) Filed: Mar. 6, 2012

(65) Prior Publication Data

US 2012/0168871 A1 Jul. 5, 2012

Related U.S. Application Data

(63) Continuation of application No. 12/077,379, filed on Mar. 19, 2008, now Pat. No. 8,154,104.

(30) Foreign Application Priority Data

Aug. 23, 2007 (KR) .................. 10-2007-0085013

(51) Int. Cl.
*H01L 27/06* (2006.01)
(52) U.S. Cl.
USPC ........................... 257/368; 257/536; 257/296
(58) Field of Classification Search
USPC .............. 257/204, 274, 369, 371, 379–381, 257/536–538, E27.062–E27.067, E27.108, 257/E21.63–E21.644
See application file for complete search history.

(56) References Cited

U.S. PATENT DOCUMENTS

| 4,933,739 | A | * | 6/1990 | Harari | 257/621 |
| 5,773,871 | A | * | 6/1998 | Boyd et al. | 257/532 |
| 6,146,945 | A | | 11/2000 | Osanai | |
| 6,171,942 | B1 | | 1/2001 | Lee et al. | |
| 6,172,389 | B1 | | 1/2001 | Sakoh | |
| 6,228,714 | B1 | | 5/2001 | Choi | |
| 6,383,903 | B1 | | 5/2002 | Lai et al. | |

(Continued)

FOREIGN PATENT DOCUMENTS

| JP | S57211253 | 12/1982 |
| JP | 63087762 | 4/1988 |

(Continued)

OTHER PUBLICATIONS

"Semiconductor Device Having a Resistor and Methods of Forming the Same" Specification, Drawings, Claims and Prosecution History, of U.S. Appl. No. 12/077,379, filed Mar. 19, 2008, by Jinhyun Shin, et al.

*Primary Examiner* — Marcos D. Pizarro
*Assistant Examiner* — Sue Tang
(74) *Attorney, Agent, or Firm* — Onello & Mello, LLP

(57) ABSTRACT

In a semiconductor device and a method of making the same, the semiconductor device comprises a substrate including a first region and a second region. At least one first gate structure is on the substrate in the first region, the at least one first gate structure including a first gate insulating layer and a first gate electrode layer on the first gate insulating layer. At least one isolating structure is in the substrate in the second region, a top surface of the isolating structure being lower in height than a top surface of the substrate. At least one resistor pattern is on the at least one isolating structure.

13 Claims, 23 Drawing Sheets

(56) References Cited

U.S. PATENT DOCUMENTS

| | | |
|---|---|---|
| 6,667,507 B2 | 12/2003 | Shirota et al. |
| 6,873,016 B2 | 3/2005 | Park et al. |
| 6,977,409 B2 | 12/2005 | Shirota et al. |
| 7,109,566 B2 * | 9/2006 | Shin .................. 257/536 |
| 7,361,951 B2 | 4/2008 | Shirota et al. |
| 2002/0038884 A1 | 4/2002 | Shirota et al. |
| 2002/0127802 A1 | 9/2002 | Goda et al. |
| 2004/0081002 A1 | 4/2004 | Shirota et al. |
| 2005/0250278 A1 | 11/2005 | Randolph |
| 2006/0022276 A1 | 2/2006 | Park et al. |
| 2006/0033151 A1 | 2/2006 | Shirota et al. |
| 2006/0054953 A1 * | 3/2006 | Son et al. .................. 257/296 |
| 2006/0267144 A1 | 11/2006 | Aitken et al. |

FOREIGN PATENT DOCUMENTS

| | | |
|---|---|---|
| JP | H07321327 | 12/1995 |
| JP | H11284089 | 10/1999 |
| JP | 2000077633 | 3/2000 |
| JP | 2001257272 | 9/2001 |
| JP | 2002110825 | 4/2002 |
| KR | 1020000000885 | 1/2000 |
| KR | 1020020043125 | 6/2002 |
| KR | 100672939 | 1/2007 |

* cited by examiner

SEMICONDUCTOR DEVICE HAVING A STABLE RESISTOR AND METHODS OF FORMING THE SAME

RELATED APPLICATIONS

This application is a continuation of U.S. patent application Ser. No. 12/077,379, filed Mar. 19, 2008, which claims priority under 35 U.S.C. 119 to Korean Patent Application No. 10-2007-0085013, filed on Aug. 23, 2007, the content of which is incorporated herein by reference in its entirety.

BACKGROUND OF THE INVENTION

With the continued emphasis on highly integrated electronic devices, there is an ongoing need for semiconductor devices that operate at higher speed and lower power and have increased device density. To achieve these goals, it is necessary for devices to be formed with increased integration and for device components to be formed of lower-resistivity materials. At the same time, there is a need for analog circuitry in modern digital systems. For example, in the peripheral region of a semiconductor memory device, there is a need for resistors to be formed with resistance values that are predicable and within tight tolerance levels. With the continued pressure toward further integration of devices, it is increasingly difficult to fabricate resistors having accurate resistance values.

In contemporary devices, transistor gates are commonly formed of $WSi_x$, as this material provides relatively low resistance, and reliable application. At the same time, resistors can also be formed to have somewhat predictable values using $WSi_x$.

With increased integration, it is preferred to form the gate material of transistor devices using different silicide materials such as $CoSi_x$ and $NiSi_x$, or metal gate materials such as W, Cu or Al, for example, since such materials can be formed to have lower resistance. However, when using such materials to form a resistor, it has been determined that the resistivity of such materials is highly susceptible to heat and thickness. For example, when a silicide layer is used, the resistivity of a resulting resistor will vary greatly in accordance with succeeding processes that can generate a heat budget, since the properties of $CoSi_x$ or $NiSi_x$ can be varied with a varying heat budget. Also, when a metal layer is used to form the resistor, the metal layer thickness can be varied widely by an applied chemical-mechanical polishing (CMP) procedure that is used during fabrication of the metal gates of the device. This in turn can cause so-called "dishing" of the resistor material, which can greatly change the resistance value of the resulting resistor.

SUMMARY OF THE INVENTION

Embodiments of the present invention are directed to semiconductor devices and methods of forming the same including resistors that have predictable resistance values that remain relatively stable though the fabrication process. In particular, the embodiments of the present invention provide resistors that are not affected by silicidation processes that occur at the gates of transistors in other regions of the device, or in the same region of the device. In particular, a top surface of an isolating structure on which the resistor pattern is formed in a peripheral region of the device is recessed in the substrate so that it has a top surface that is lower in height than an upper surface of the substrate. Also, the resistor pattern can be buried in an insulating layer that lies above the resistor pattern. Thus, the resistor is not silicidized during silicidation of the neighboring gate patterns, which otherwise can change its resistance value. Alternatively, the resistor is not metallized during metallization of neighboring gate patterns, which could also otherwise affect its resistance value. Furthermore, heat applied to the resistor is reduced, thereby mitigating or avoiding change of the resistance value due to applied heat. In addition, removal of material of the resistor is avoided or minimized during fabrication, so that variation of resistance value during fabrication is avoided or minimized.

In one aspect, a semiconductor device comprises: a substrate including a first region and a second region; at least one first gate structure on the substrate in the first region, the at least one first gate structure including a first gate insulating layer and a first gate electrode layer on the first gate insulating layer; at least one isolating structure in the substrate in the second region, a top surface of the isolating structure being lower in height than a top surface of the substrate; and at least one resistor pattern on the at least one isolating structure.

In one embodiment, the first region comprises a cell region of the device, wherein the at least one first gate structure comprises at least one cell gate structure, and wherein the second region comprises a peripheral region of the device.

In another embodiment, the first gate insulating layer comprises a tunnel insulating layer; and the at least one first gate structure comprises the tunnel insulating layer, a charge storage layer on the tunnel insulating layer, a blocking insulating layer on the charge storage layer and a first gate electrode layer on the blocking insulating layer.

In another embodiment, the at least one first gate structure comprises multiple first gate structures and in a subset of the multiple first gate structures, the first gate electrode layer and the charge storage layer are in direct electrical contact.

In another embodiment, the at least one first gate structure includes a silicide region at a top portion thereof.

In another embodiment, no silicide region is present on the at least one resistor pattern.

In another embodiment, the at least one first gate structure includes a metal layer at a top portion thereof.

In another embodiment, no metal layer is present on the at least one resistor pattern.

In another embodiment, the at least one first gate structure forms a gate for a non-volatile memory cell in the first region.

In another embodiment, the device further comprises an insulating layer on the at least one isolating structure and below the resistor pattern.

In another aspect, a method of forming a semiconductor device including a first region and a second region comprises: providing a gate insulating layer on a substrate, the substrate having an upper surface; providing isolating structures in the substrate in the first region and in the second region; providing a first gate electrode layer on the gate insulating layer in the first region and in the second region; removing portions of the first gate electrode layer and the gate insulating layer in the second region to expose the isolating structures in the second region; removing upper portions of the exposed isolating structures to recess the isolating structures in the substrate so that top surfaces of the isolating structures are lower in height than the upper surface of the substrate; providing a second gate electrode layer in the first region on the first gate electrode layer and in the second region on the recessed isolating structures; and patterning the second gate electrode layer, the first gate electrode layer, and the gate insulating layer in the first region to form first gate structures in the first region, and patterning the second gate electrode layer to form resistor patterns on the recessed isolating structures in the second region.

In one embodiment, the first region comprises a cell region of the device, wherein the first gate structures comprise cell gate structures, and wherein the second region comprises a peripheral region of the device.

In another embodiment, the gate insulating layer comprises a tunnel insulating layer and the method further comprises: providing a charge storage layer on the tunnel insulating layer; providing a blocking insulating layer on the charge storage layer and on the isolating structures in the first region and in the second region, wherein the first gate electrode layer is provided on the blocking insulating layer in the first region and in the second region; removing portions of the first gate electrode layer and the blocking insulating layer in the first region to expose portions of the underlying charge storage layer in the first region, wherein providing the second gate electrode layer in the first region on the first gate electrode layer provides the second gate electrode layer in contact with exposed portions of the underlying charge storage layer; wherein removing portions of the first gate electrode layer and the gate insulating layer in the second region to expose the isolating structures in the second region further comprises patterning the blocking insulating layer in the second region; and further patterning the blocking insulating layer and the charge storage layer in the first region to form the first gate structures in the first region.

In another embodiment, removing upper portions of the exposed isolating structures to form recesses in the isolating structures is performed in a same process step as that of removing portions of the first gate electrode layer and the blocking insulating layer in the first region to expose portions of the underlying charge storage layer in the first region.

In another embodiment, the method further comprises: providing an insulating layer on the first gate structures and the resistor patterns; and planarizing the insulating layer to expose upper surfaces of the patterned second gate electrode layer of the first gate structures in the first region, wherein in the process of planarizing of the insulating layer, portions of the insulating layer remain on the resistor patterns to cover the resistor patterns.

In another embodiment, the method further comprises performing a silicidation process on the exposed upper surfaces of the patterned second gate electrode layers of the first gate structures, wherein the portions of the insulating layer that remain on the resistor patterns prevent the resistor patterns from becoming silicidized.

In another embodiment, the method further comprises: removing upper portions of the patterned second gate electrode layers of the exposed first gate structures to recess the first gate structures relative to the insulating layer; providing a metal layer on the insulating layer and on the recessed exposed first gate structures; and planarizing the metal layer to expose the insulating layer.

In another embodiment, providing isolating structures in the substrate comprises: providing trenches through the gate insulating layer in the first region and in the second region; and filling the trenches with insulating material.

In another embodiment, the method further comprises, following providing isolating structures in the substrate, removing exposed initial upper portions of the isolating structures in the first region and in the second region to initially recess the isolating structures, wherein removing upper portions of the exposed isolating structures to recess the isolating structures further recesses the isolating structures.

In another embodiment, providing isolation structures in the substrate is performed prior to providing the gate insulating layer on the substrate.

In another aspect, a method of forming a semiconductor device including a first region and a second region comprises: providing a gate insulating layer on a substrate, the substrate having an upper surface; providing isolating structures in the substrate in the first region and in the second region; providing a first gate electrode layer on the gate insulating layer in the first region and in the second region; providing a second gate electrode layer in the first region on the first gate electrode layer and in the second region on the first gate electrode layer; and patterning the second gate electrode layer, the first gate electrode layer, and the gate insulating layer in the first region to form first gate structures in the first region, and patterning the second gate electrode layer, the first gate electrode layer, and the gate insulating layer in the second region to expose the underlying isolating structures in the second region; removing upper portions of the exposed isolating structures to recess the isolating structures in the substrate so that top surfaces of the isolating structures are lower in height than the upper surface of the substrate; and providing resistor patterns on the recessed isolating structures.

In one embodiment, the first region comprises a cell region of the device, wherein the first gate structures comprise cell gate structures, and wherein the second region comprises a peripheral region of the device.

In another embodiment, the gate insulating layer comprises a tunnel insulating layer and the method further comprises: providing a charge storage layer on the tunnel insulating layer; providing a blocking insulating layer on the charge storage layer and on the isolating structures in the first region and in the second region, wherein the first gate electrode layer is provided on the blocking insulating layer in the first region and in the second region; removing portions of the first gate electrode layer and the blocking insulating layer in the first region to expose portions of the underlying charge storage layer in the first region, and wherein providing the second gate electrode layer in the first region on the first gate electrode layer provides the second gate electrode layer in contact with exposed portions of the underlying charge storage layer; and further patterning the blocking insulating layer and the charge storage layer in the first region to form the first gate structures in the first region, and further patterning the blocking insulating layer on the isolating structures in the second region to expose the underlying isolating structures.

In another embodiment, providing resistor patterns on the recessed isolating structures comprises: providing an insulating layer on the first gate structures of the first region and on the recessed isolating structures in the second region; and providing the resistor patterns on the insulating layer, over the recessed isolating structures.

In another embodiment, the method further comprises: providing an insulating layer on the first gate structures and the resistor patterns; and planarizing the insulating layer to expose upper surfaces of the patterned second gate electrode layer of the first gate structures in the first region, wherein in the process of planarizing of the insulating layer, portions of the insulating layer remain on the resistor patterns to cover the resistor patterns.

In another embodiment, the method further comprises: performing a silicidation process on the exposed upper surfaces of the patterned second gate electrode layers of the first gate structures, wherein the portions of the insulating layer that remain on the resistor patterns prevent the resistor patterns from becoming silicidized.

In another embodiment, the method further comprises: removing upper portions of the patterned second gate electrode layers of the exposed first gate structures to recess the first gate structures relative to the insulating layer; providing a metal layer on the insulating layer and on the recessed exposed first gate structures; and planarizing the metal layer to expose the insulating layer.

In another embodiment, providing isolating structures in the substrate comprises: providing trenches through the gate insulating layer in the first region and in the second region; and filling the trenches with insulating material.

In another embodiment, the method further comprises, following providing isolating structures in the substrate, removing exposed initial upper portions of the isolating structures in the first region and in the second region to initially recess the isolating structures, and wherein removing upper portions of the exposed isolating structures further recesses the isolating structures.

In another embodiment, patterning the second gate electrode layer, the first gate electrode layer, and the gate insulating layer in the second region to expose the underlying isolating structures in the second region is performed in a same process step as that of patterning the second gate electrode layer, the first gate electrode layer, and the gate insulating layer in the first region to form first gate structures in the first region.

In another embodiment, providing isolation structures in the substrate is performed prior to providing the gate insulating layer on the substrate.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings:

FIGS. 2A-10A are cross-sectional views of the formation of a cell region of the semiconductor device of FIG. 1, taken along section lines I-I' and II-II' in accordance with an embodiment of the present invention. FIGS. 2B-10B are cross-sectional views of the formation of a peripheral region of the semiconductor device of FIG. 1, taken along section lines III-III' and IV-IV' in accordance with an embodiment of the present invention.

FIGS. 11A-13A are cross-sectional views of the formation of a cell region of the semiconductor device of FIG. 1, taken along section lines I-I' and II-II' in accordance with another embodiment of the present invention. FIGS. 11B-13B are cross-sectional views of the formation of a peripheral region of the semiconductor device of FIG. 1, taken along section lines III-III' and IV-IV' in accordance with another embodiment of the present invention.

FIGS. 14A-19A are cross-sectional views of the formation of a cell region of the semiconductor device of FIG. 1, taken along section lines I-I' and II-II' in accordance with another embodiment of the present invention. FIGS. 14B-19B are cross-sectional views of the formation of a peripheral region of the semiconductor device of FIG. 1, taken along section lines III-III' and IV-IV' in accordance with another embodiment of the present invention.

FIGS. 20A-22A are cross-sectional views of the formation of a cell region of the semiconductor device of FIG. 1, taken along section lines I-I' and II-II' in accordance with another embodiment of the present invention. FIGS. 20B-22B are cross-sectional views of the formation of a peripheral region of the semiconductor device of FIG. 1, taken along section lines III-III' and IV-IV' in accordance with another embodiment of the present invention.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
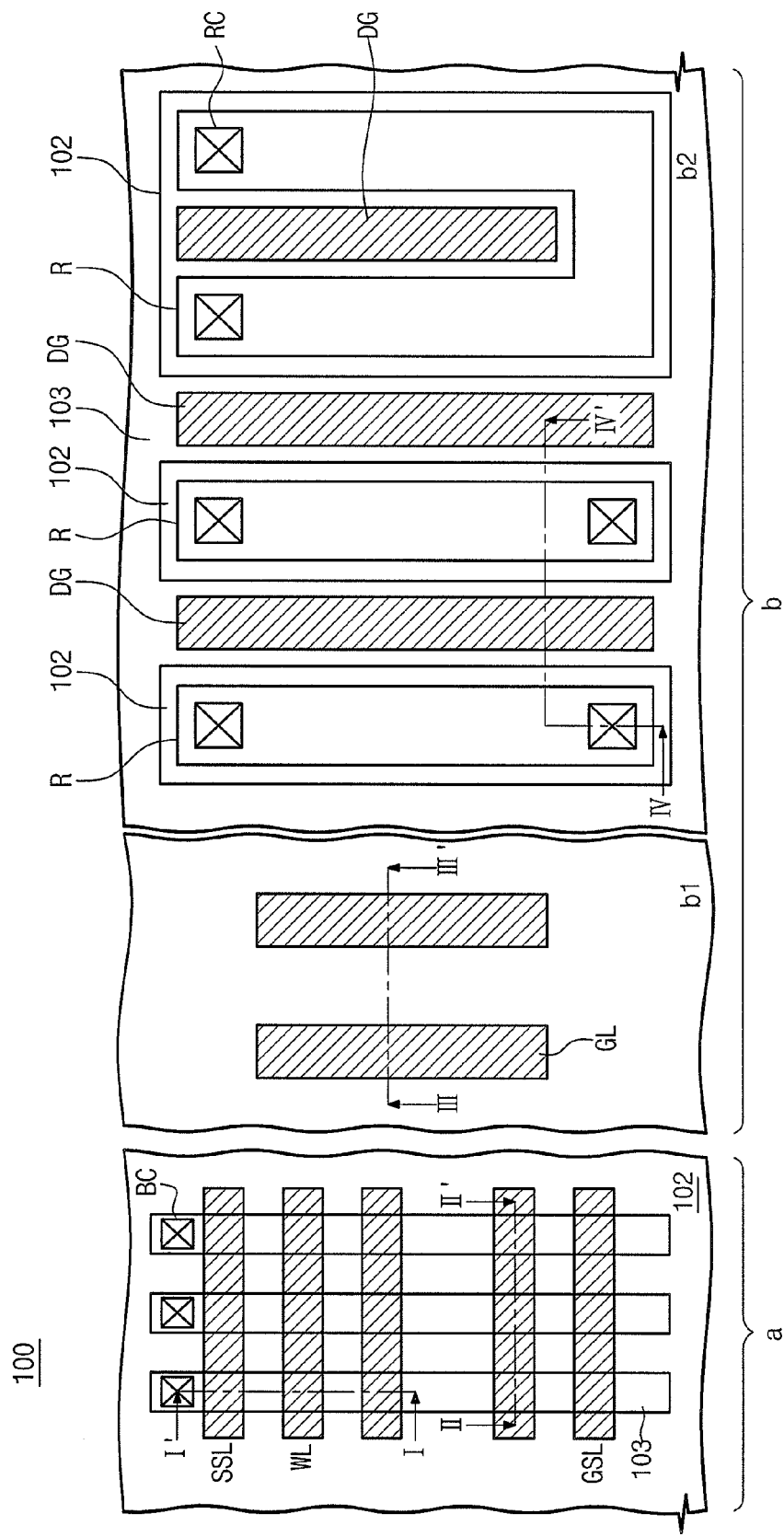
FIG. 1 is a planar top view of a semiconductor device including a cell region and including a resistor structure in a peripheral region, in accordance with an embodiment of the present invention.

FIG. 1 is a planar top view of a semiconductor device including a cell region and including a resistor structure in a peripheral region, in accordance with an embodiment of the present invention. A semiconductor device, for example a semiconductor memory device, includes a cell region a and a peripheral region b. The cell region a includes a plurality of memory cells that are arranged in rows and columns. In the example provided, string selection lines SSL, word lines WL, and ground selection lines GSL extend in a row direction of the cell region a. Active regions 103 forming bit lines extend in the column direction. Memory cells of the cell region a are provided at the intersections of the word lines WL and the bit lines. Bit line contacts BC are vertical contacts that provide interconnectivity with the active regions 103 of the memory cells. The memory cells in the cell region a are isolated from each other by isolation regions 102.

The semiconductor device further includes a peripheral region b that includes, for example, a circuit region b1 and a resistor region b2. The circuit region b1 of the peripheral region b in this example includes gate lines GL that comprise gates of transistors. The resistor region b2 of the peripheral region b in this example, includes a plurality of resistor traces R that are formed on isolation regions 102. Resistor contacts RC are vertical contacts that provide interconnectivity with first and second end terminals of the resistor traces R. The resistor traces R illustrated in FIG. 1 are mere examples of such traces, and one skilled in the art would readily appreciate that other resistor trace configurations are equally applicable to the principles of the embodiments of the present invention. The isolation regions 102 of the resistor region b2 are surrounded by active regions 103, and dummy gate patterns DG can be provided between neighboring resistor traces R, and between adjacent legs of a single, meandering, trace, as shown. For purposes of the present invention, the dummy gate patterns can comprise gate patterns for non-functional gates in the resistor region b2, or optionally, can comprise gate patterns for functional gates in the resistor region b2.

FIGS. 2A-10A are cross-sectional views of the formation of a cell region of the semiconductor device of FIG. 1, taken along section lines I-I' and II-II' in accordance with an embodiment of the present invention. FIGS. 2B-10B are cross-sectional views of the formation of a peripheral region of the semiconductor device of FIG. 1, taken along section lines III-III' and IV-IV' in accordance with an embodiment of the present invention.

Figure 2A:
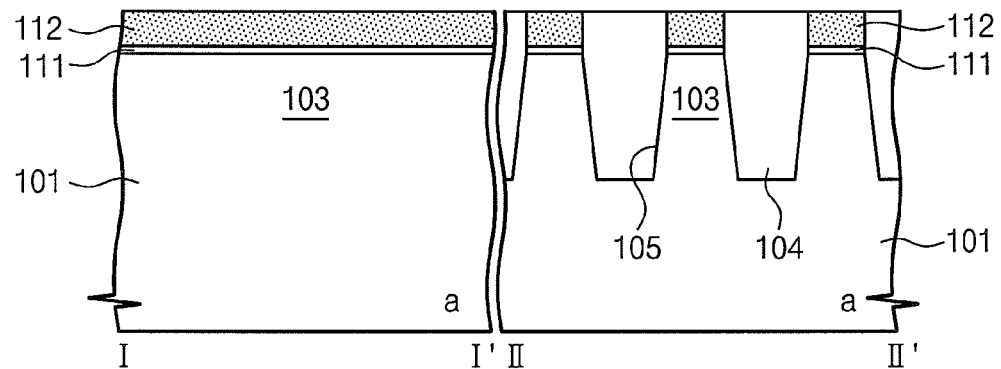
Figure 2B:
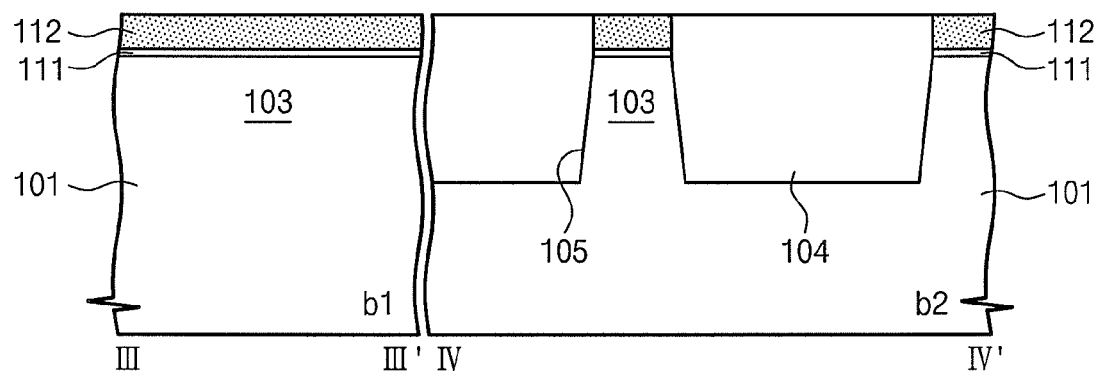

Referring to FIGS. 2A and 2B, isolation layers for forming isolation structures 104 are provided in trenches 105 formed in the cell region a and in the resistor region b2 of the peripheral region b of the substrate 101. The trenches 105 define active regions 103 in the cell and peripheral regions a, b. A tunnel insulating layer 111 and a charge storage layer 112 are provided on the active regions 103. In this example, the tunnel insulating layer 111 and the charge storage layer 112 are layers that will comprise lower elements of a non-volatile memory transistor gate in the cell region a of the resulting device; however, embodiments of the present invention are equally applicable to formation of conventional transistors that form volatile, or conventional, memory transistor gates in the cell region a. In certain embodiments, the trenches 105 for the resistor region b2 of the peripheral region b can be formed contemporaneously with trenches 105 in the cell region a. In certain embodiments, the trenches 105 can be formed prior to providing the tunnel insulating layer 111 and charge storage layer 112, for example, by using a patterned SiN layer as a hard mask to form the trenches. Alternatively, the charge storage layer 112 can first be formed and patterned and used as a mask for etching the trenches 105. The charge storage layer 112 can be formed of any of a number of applicable charge storage layer materials, including, but not limited to, a semiconductor layer, SiN, SiON, an insulating layer with nano-sized dots made of metal, a semiconductor material, an insulating material having trap sites, and the like.

Figure 3A:
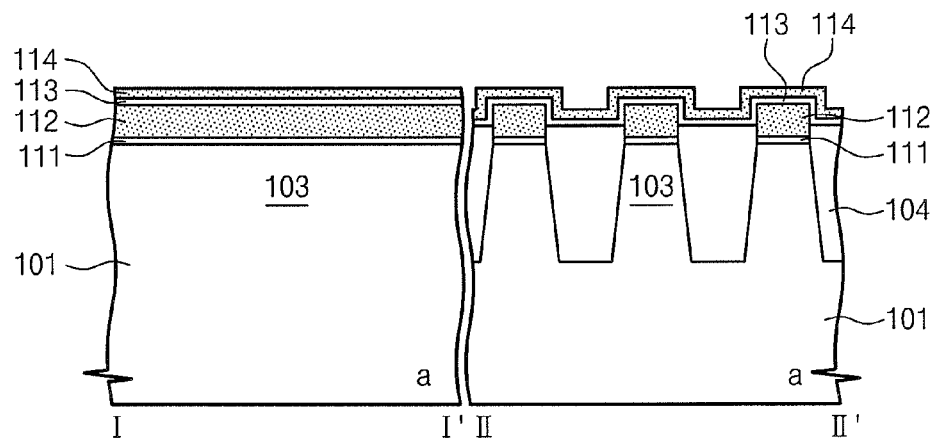
Figure 3B:
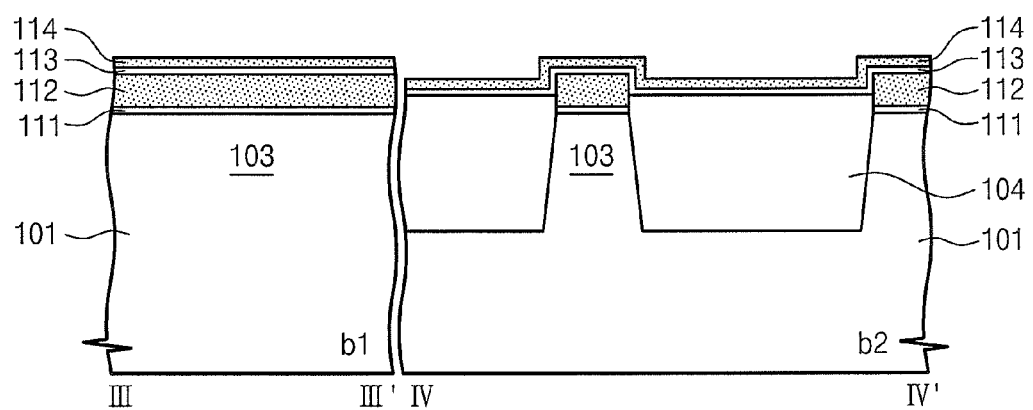

Referring to FIGS. 3A and 3B, an upper surface of the isolation structures 104 in the trenches are optionally first recessed in both the cell and peripheral regions a, b. This process operates to increase the coupling ratio between the control gate that is eventually formed and the underlying charge storage layer, as the recess process expands the surface area of the charge storage layer exposed to the blocking insulator layer.

Next, a blocking insulating layer 113 and a first gate electrode layer 114 are provided on the resulting structure. In various embodiments, the blocking insulating layer 113 comprises at least one of $HfO_2$, $Hf_{1-x}Al_xO_y$, $Al_2O_3$, $La_2O_3$, $Hf_xSi_{1-x}O_2$, Hf—Si-oxynitride, $ZrO_2$, $Zr_xSi_{1-x}O_2$, Zr—Si-oxynitride, and combinations thereof or one of $Ta_2O_5$, $TiO_2$, PZT[Pb(Zi,Ti)$O_3$], PbTi$O_3$, PbZr$O_3$, La-doped PZT[(Pb, La)(Zi, Ti)$O_3$], PbO, SrTi$O_3$, BaTi$O_3$, BST[(Ba, Sr)Ti$O_3$], SBT (SrBi$_2$Ta$_2$O$_9$), and Bi$_4$Ti$_3$O$_{12}$, and combinations thereof. In various embodiments, the first gate electrode layer 114 comprises a semiconductor layer or metal layer. For example, the metal layer can be one of Titanium (Ti), Titanium nitride (TIN), Tantalum nitride (TAN), Tantalum (Ta), Tungsten (W), Hafnium (Hf), Niobium (Nb), Molybdenum (Mo), Ruthenium dioxide (RuO$_2$), Molybdenum nitride (Mo$_2$N), Iridium (Ir), Platinum (Pt), Cobalt (Co), Chrome (Cr), Ruthenium monoxide (RuO), Titanium aluminide (Ti$_3$Al), Ti$_2$AlN, Palladium (Pd), Tungsten nitride (WNx), Tungsten silicide (WSi) and Nickel suicide (NiSi), and combinations thereof.

Figure 4A:
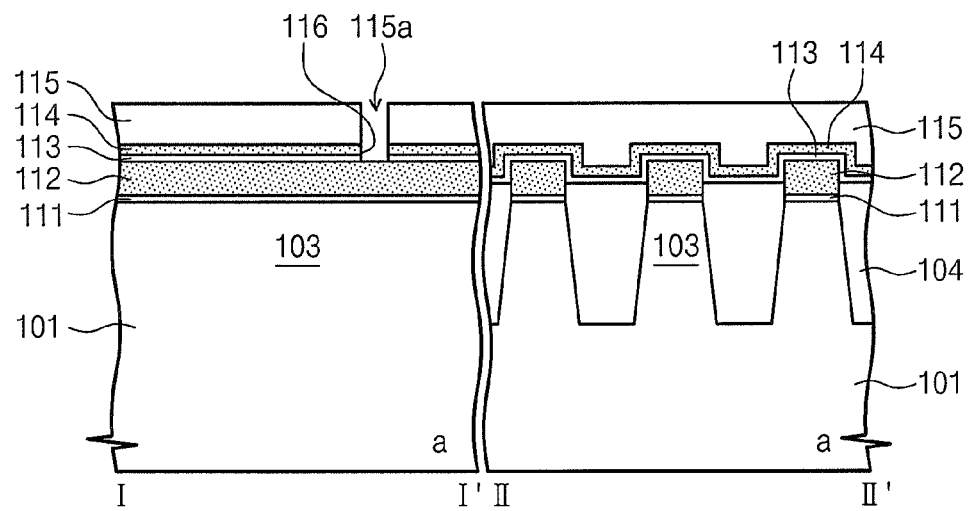
Figure 4B:
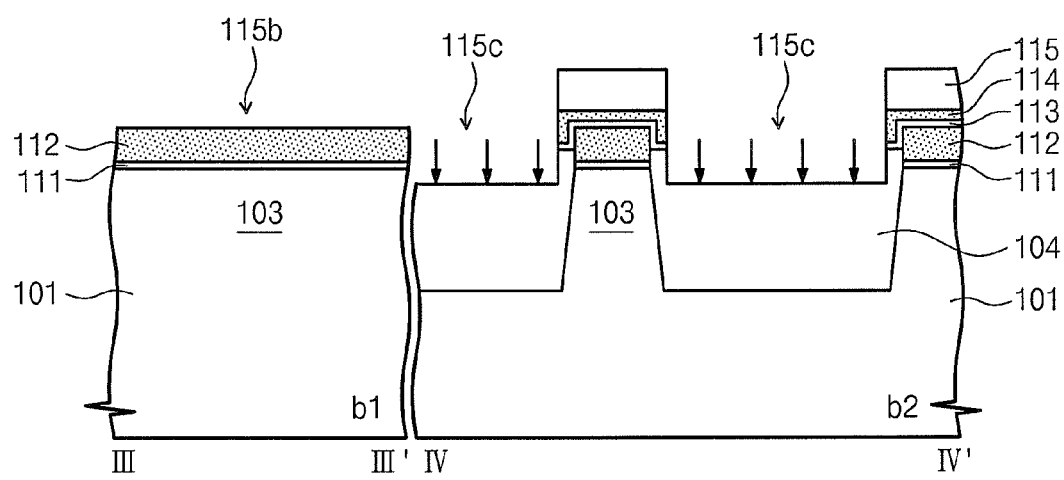

Referring to FIGS. 4A and 4B, a mask layer 115 is provided over the resulting structure, and the mask layer is patterned to form first openings 115a, second openings 115b and third openings 115c that expose the underlying first gate electrode layer 114. The exposed portions of the first gate electrode layer 114 and the underlying blocking insulating layer 113 are etched.

In the first openings 115a, the underlying charge storage layer 112 is exposed by the etching process to provide a butting contact region 116 of selection gates of the cell region a to be formed. For example, the so-called butting process operates to prepare certain transistors in the cell region for conversion into conventional transistors by removing portions of the blocking insulating layer 113, while other transistors in the cell region remain as non-volatile memory cell transistors. For example, the butting process can be performed in regions where the string selection line SSL and ground selection line GSL transistors, which commonly operate as conventional transistors, are to be formed. In the second openings 115b, the underlying charge storage layer 112 is exposed as a result of the etching process. In the third openings 115c, the upper surfaces of the isolation structures 104 are etched so as to recess the isolation structures 104 in the resistor region b2 of the peripheral region b. In this manner, the isolation structures 104 in the resistor region b2 of the peripheral region b can be recessed contemporaneously with, or during the same process step as, removal of the blocking insulating layer 113 for certain transistor gates in the cell region a. As a result, top, or upper, surfaces of the isolation structures 104 are recessed relative to the upper surface of the substrate 101 so that the top surfaces of the isolation structures 104 are lower in height that a top surface of the substrate 101, for example a top surface of the active regions 103 of the substrate 101.

Figure 5A:
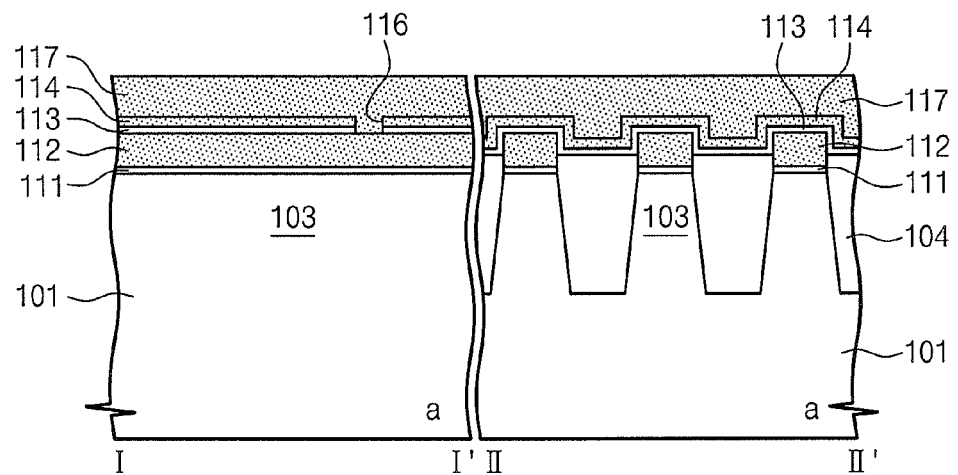
Figure 5B:
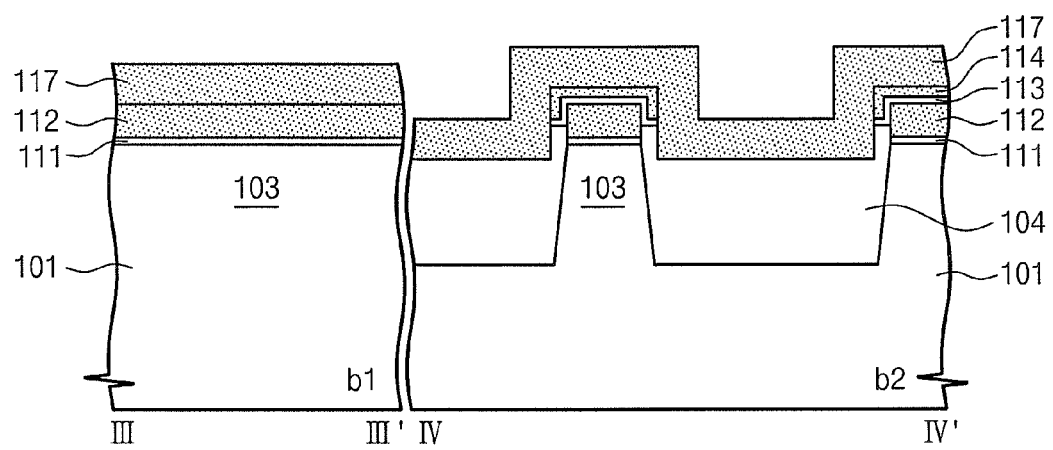

Referring to FIGS. 5A and 5B, the mask layer 115 is removed, and a second gate electrode layer 117 is applied to the resulting structure. In the butting contact region 116 of the cell region a, the second gate electrode layer 117 is in contact with the underlying charge storage layer 112. Since the underlying charge storage layer 112 can be formed of an insulative material, the role of the butting contact region 116 is not necessarily to make electrical contact between the second gate electrode layer 117 and the underlying charge storage layer 112, but rather to bring the lower portion of the second gate electrode layer 117 in the butting contact region 116 into a lower position so as to be coupled with the active region lying below the underlying tunnel insulating layer 111 below the butting region. In this manner, the resulting transistor to be formed in the butting region will operate as a conventional transistor. In the circuit region b1 of the peripheral region b, the second gate electrode layer 117 lies directly on the charge storage layer 112. In the resistor region b2 of the peripheral region b, the second gate electrode layer 117 lies on the recessed upper surface of the isolation structures 104.

Figure 6A:
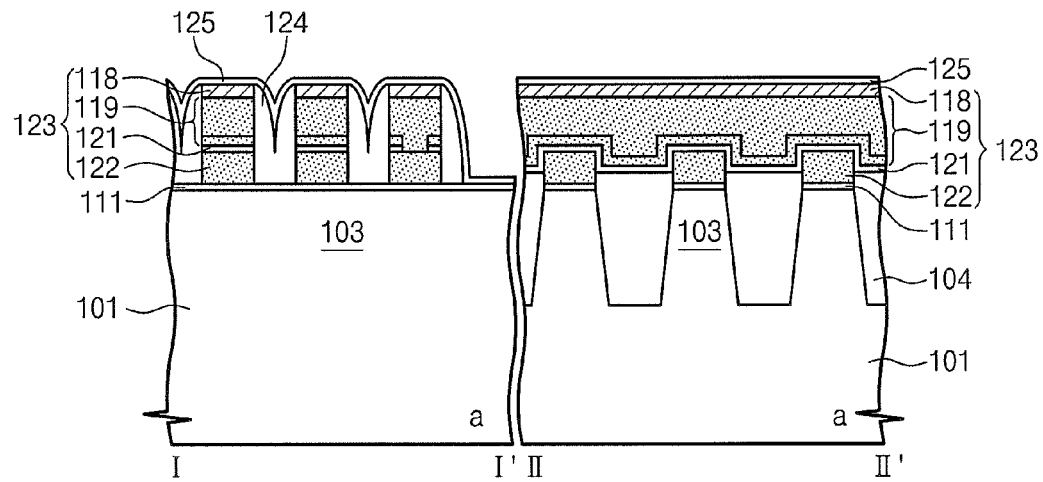
Figure 6B:
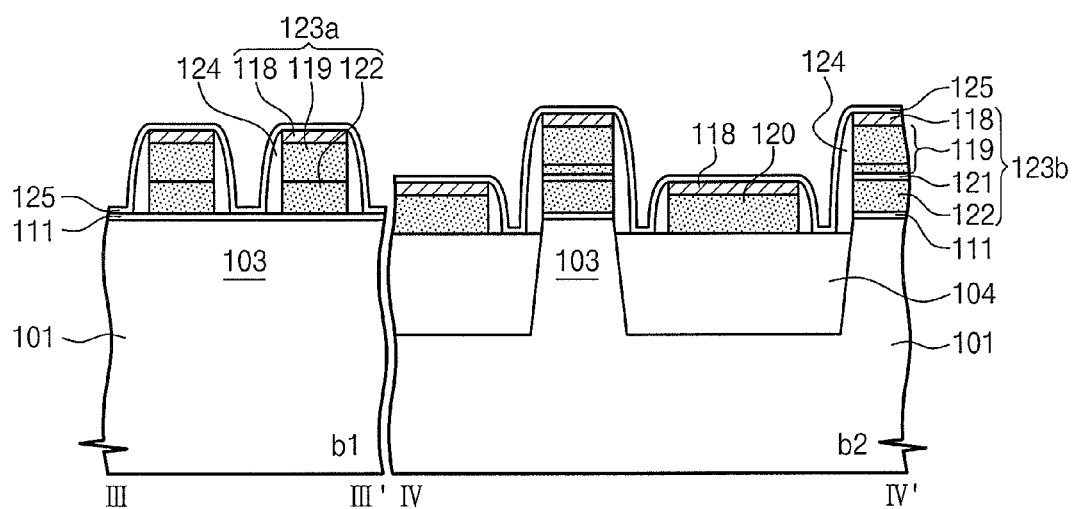

Referring to FIGS. 6A and 6B, the resulting structure is patterned using conventional patterning techniques to form preliminary gate patterns 123, 123a, 123b in the cell region a and in the peripheral region b of the device, and to form resistor patterns 120 in the resistor region b2 of the peripheral region b of the device. In one embodiment, the preliminary gate patterns 123, 123a, 123b and resistor patterns 120 are patterned using an applied mask pattern 118.

The preliminary gate patterns 123 in the cell region a comprise the tunnel insulating layer 111, the patterned charge storing layer 122, the patterned blocking insulating layer 121, the patterned first and second gate electrode layers 119, and the mask pattern 118. The patterned first and second gate electrode layers 119 are operable as a control gate and the patterned charge storage layer 122 is operable as a floating gate for the floating gate transistors of the cell region a.

The preliminary gate patterns 123a in the circuit region b1 of the peripheral region b comprise the tunnel insulating layer 111, the patterned charge storing layer 122, the patterned second gate electrode layer 119, and the mask pattern 118. The patterned first and second gate electrode layers 119 are operable as a conventional gate for the conventional transistors of the circuit region b1 of the peripheral region b.

The preliminary gate patterns 123b in the resistor region b2 of the peripheral region b comprise the tunnel insulating layer 111, the patterned charge storing layer 122, the patterned blocking insulating layer 121, the patterned first and second gate electrode layers 119, and the mask pattern 118. The preliminary gate patterns 123b in the resistor region b2 are formed between the resistor patterns 120 in the active regions 103 between the isolation structures 104, and need not function as operable gates for the device, and therefore can be referred to as "dummy gate patterns", in certain applications of the embodiments of the present invention. In aspects of the embodiments of the present invention, top, or upper, surfaces of the isolation structures 104 in the resistor region b2 of the peripheral region b are recessed relative to the upper surface of the substrate 101 so that the top surfaces of the isolation structures 104 are lower in height that a top surface of the substrate 101, for example a top surface of the active regions 103 of the substrate 101. As a result, the height of the top surface of the preliminary dummy gate patterns 123b in the resistor region b2 of the peripheral region b can be greater than the height of the top surface of the resistor patterns 120. Alternatively, the height of the top surface of the preliminary gate patterns 123a in the circuit region b1 of the peripheral region b can be greater than the height of the top surface of the resistor patterns 120. This difference in height provides certain key advantages in the formation of the devices, as will be described in further detail herein.

Gate spacers 124 are then formed at sidewalls of the preliminary gate patterns 123, 123a, 123b according to conventional fabrication techniques using an insulative layer, for example, comprising $SiO_2$, SiN or SION. An etch stop layer 125 is then applied to the resulting structure, including the gate spacers, according to conventional fabrication techniques. The etch stop layer 125 can have etching selectivity relative to an insulating layer 126 to be subsequently applied.

Figure 7A:
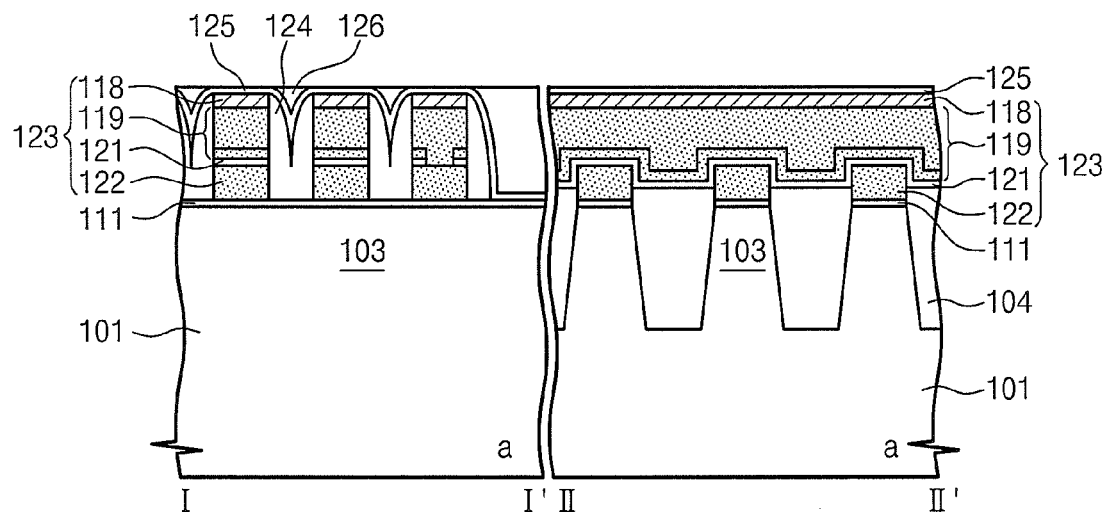
Figure 7B:
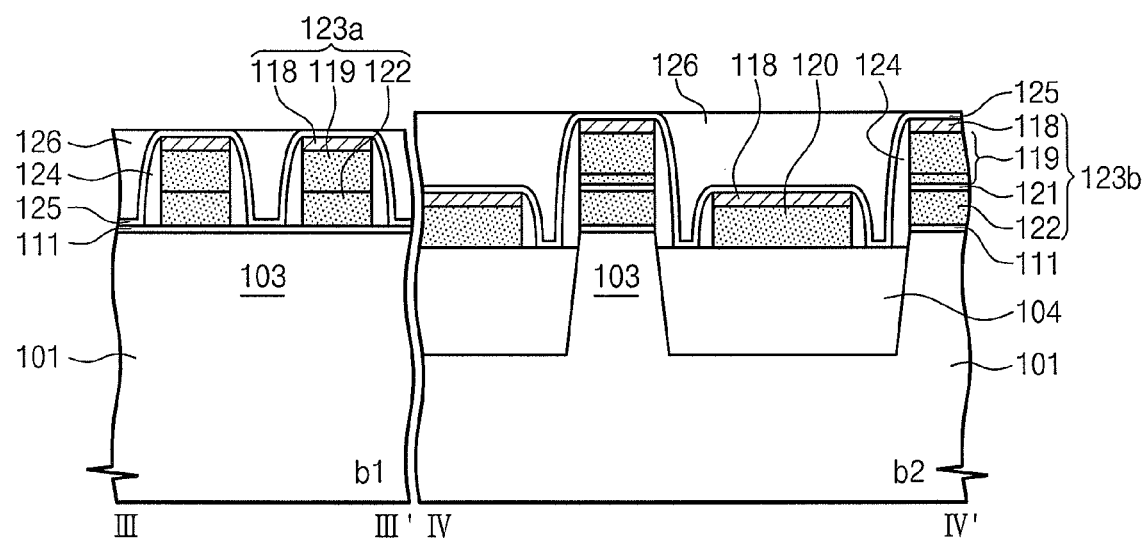

Referring to FIGS. 7A and 7B, an insulating layer 126 is applied to the resulting structure. In one example embodiment, the insulating layer 126 comprises $SiO_2$, a low-k material or its combination, formed according to conventional fabrication techniques. The applied insulating layer fills any remaining space between the preliminary gate patterns 123, 123a in the cell region a and in the circuit region b1 of the peripheral region b, and fills the space between the preliminary dummy gate patterns in the resistor region b2 of the peripheral region b on the resistor patterns 120. An upper portion of the insulating layer 126 is then removed, or planarized, to expose the upper surfaces of the preliminary gate patterns 123, 123a and preliminary dummy gate patterns 123b using the etch stop layer 125 as an etch stop.

Figure 8A:
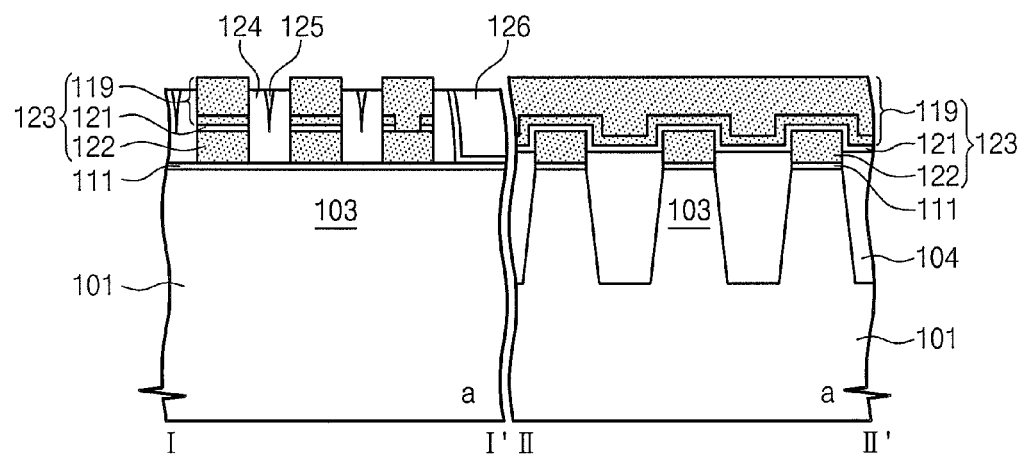
Figure 8B:
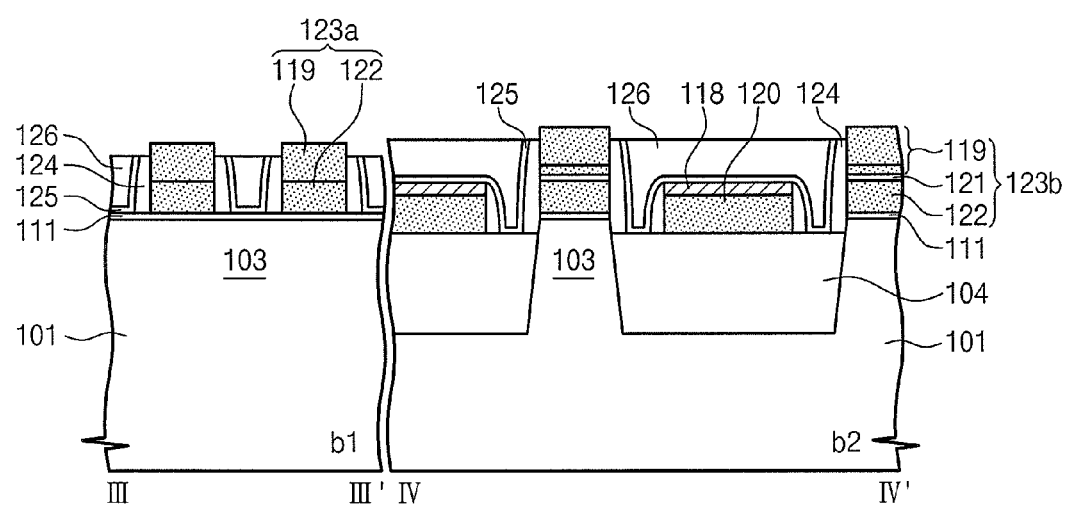

Referring to FIGS. 8A and 8B, upper portions of the preliminary gate patterns 123, 123a, 123b are removed using conventional planarization processes such as CMP or blanket etch. During this process, portions of the etch stop layer 125 are removed to expose the underlying mask patterns 118 at top regions of the preliminary gate patters 123, 123a, 123b. The mask patterns 118 are also removed to expose the conductive second gate electrode layers 119 of the preliminary gate patterns 123, 123a, 123b. At the same time, upper portions of the insulating layer 126 and gate spacers 124 are removed as a result of the removal process. During this operation, it can be seen that the resistor pattern 120 lies embedded under a body of the insulating layer 126 in the recess between the dummy preliminary gate patterns 123b, since, as described above, the top surfaces of the isolation structures 104 are lower in height that a top surface of the substrate 101, and, accordingly, a top portion of the resistor pattern 120 lies at a height above the substrate 101 that is less than a height of the top of the second gate electrode layer of the neighboring dummy preliminary gate patterns 123b. The insulating layer 126 thus operates to protect the resistor pattern 120 from any planarization or material removal during this step, since the resistor pattern 120 lies below the insulating layer 126. Thus, resistivity of the resistor pattern 120 is not changed as a result of the removal process for exposing upper portions of the conductive second gate electrode layers 119 of the preliminary gate patterns 123, 123a, 123b.

Figure 9A:
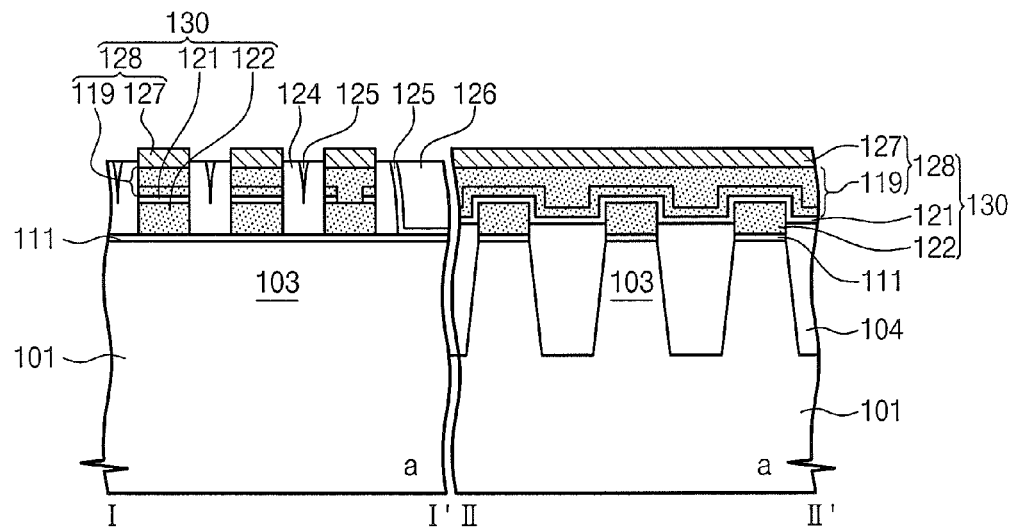
Figure 9B:
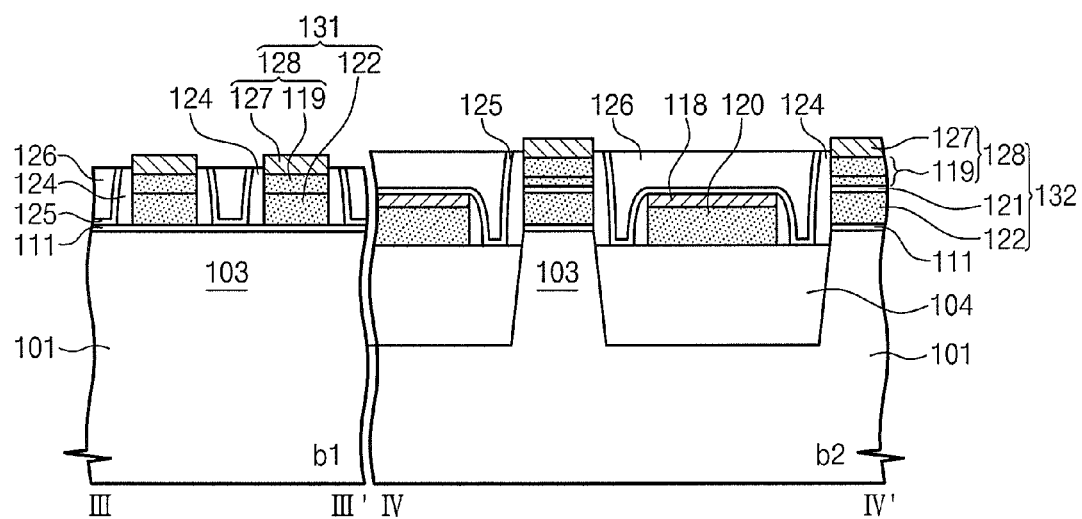

Referring to FIGS. 9A and 9B, a silicidation process is next performed to form a silicide layer 127 at top portions of the second gate electrode layer 119 of the preliminary gate patterns to reduce contact resistance at the top portions thereof. As a result, a cell region gate pattern 130 in the cell region a comprises a control gate 128 including the first and second gate electrode layers 119 and the silicide layer 127, a blocking insulating layer 121, a patterned charge storage layer 122, and a tunnel insulating layer 111. Also, a circuit region gate pattern 131 in the circuit region b1 of the peripheral region b is a conventional transistor gate pattern, and includes a conductive gate 128 including the second gate electrode layer 119 and the silicide layer 127. In addition, the resulting resistor region dummy gate pattern 132 in the resistor region b2 of the peripheral region b of the device includes a dummy control gate 128 including the first and second gate electrode layers 119 and the silicide layer 127, a blocking insulating layer 121, a dummy patterned charge storage layer 122, and a tunnel insulating layer 111.

During the silicidation process, the resistor pattern 120 is covered by the body of the insulating layer 126 in the recess between the dummy gate patterns 132, since, as described above, a top portion of the resistor pattern 120 lies at a height above the substrate 101 that is less than a height of the neighboring dummy gate patterns 132. The insulating layer 126 thus operates to protect the resistor pattern 120 from any silicidation during this step, since the resistor pattern 120 lies below the insulating layer 126. Thus, resistivity of the resistor pattern 120 is not changed, or is negligibly changed, as a result of the silicidation process.

Figure 10A:
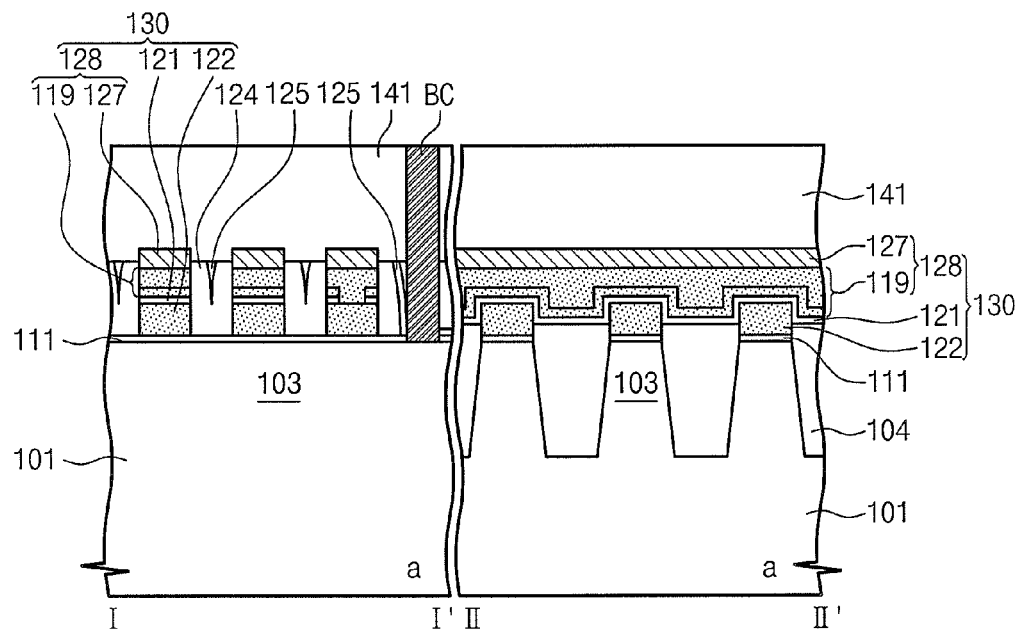
Figure 10B:
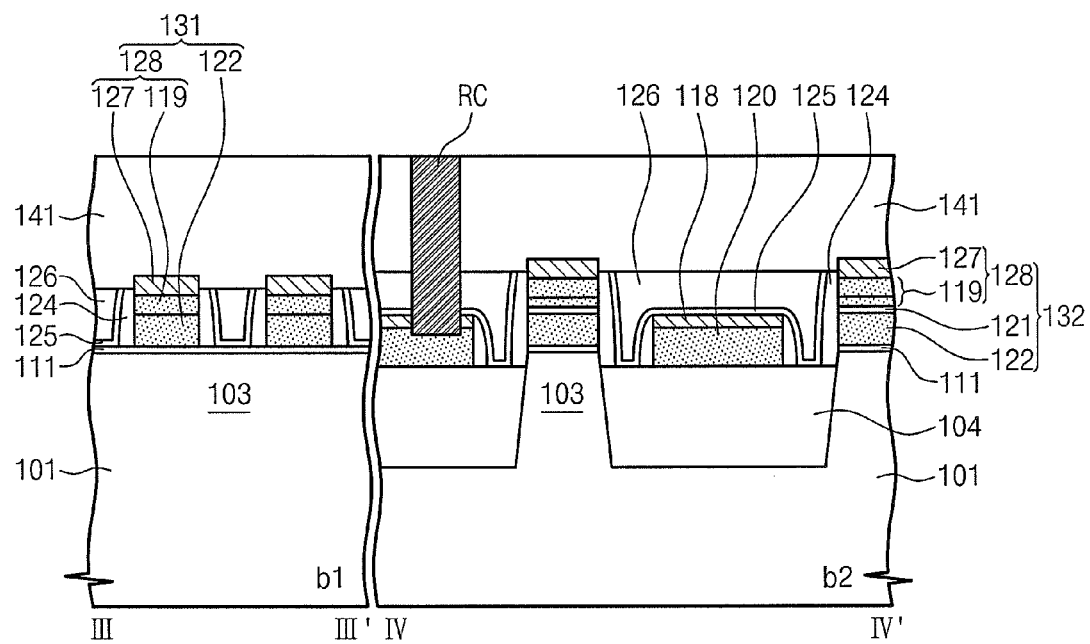

Referring to FIGS. 10A and 10B, an interlayer insulating layer 141 is applied to the resulting structure, using conventional fabrication techniques. The insulating layer 141 is patterned to form openings in which contacts such as bit line contacts BC and resistor contacts RC can be applied to designated terminals of the resulting device. As a result, a semiconductor device is formed.

The resulting semiconductor device includes a substrate 101 that is partitioned into a cell region a and a peripheral region b, the peripheral region b including a circuit region b1 and a resistor region b2. At least one cell gate structure 130 is provided in the cell region a, and includes a cell gate insulating layer, in this example, comprising tunneling layer 111 and/or charge storage layer 122 and/or blocking insulating layer 121, and a cell gate electrode layer 128, in this example, comprising first and second gate electrode layers 119 and silicide layer 127. At least one peripheral gate structure 131, 132 is on the substrate in the peripheral region b, for example in a resistor region b2 of the peripheral region b. The peripheral gate structure 131, 132 includes a peripheral gate insulating layer, for example, peripheral gate structure 131 includes insulating layers 111 and 122 and peripheral gate structure 132 includes insulating layers 111, 122 and 121. Also, the peripheral gate structure 131, 132 includes a peripheral gate electrode layer, for example, peripheral gate structure 131 includes an electrode 128 comprising the second gate electrode layer 119 and the silicide layer 127 and peripheral gate structure 132 includes an electrode 128 comprising the first and second gate electrode layers 119 and the silicide layer 127. At least one isolation structure 104 is in the peripheral region b and at least one resistor pattern 120 is provided on the at least one isolation structure 104. Top surfaces of the isolation structures 104 are recessed relative to the upper surface of the substrate 101 so that the top surfaces of the isolation structures 104 are lower in height that a top surface of the substrate 101, for example a top surface of the active regions 103 of the substrate 101.

FIGS. 11A-13A are cross-sectional views of the formation of a cell region of the semiconductor device of FIG. 1, taken along section lines I-I' and II-II' in accordance with another embodiment of the present invention. FIGS. 11B-13B are cross-sectional views of the formation of a peripheral region of the semiconductor device of FIG. 1, taken along section lines III-III' and IV-IV' in accordance with another embodiment of the present invention. In this embodiment, no silicidation of the upper portions of the electrodes of the preliminary gate patterns 121, 122, 123 takes place. Instead, a metal layer is applied to the upper portions of the electrodes.

Figure 11A:
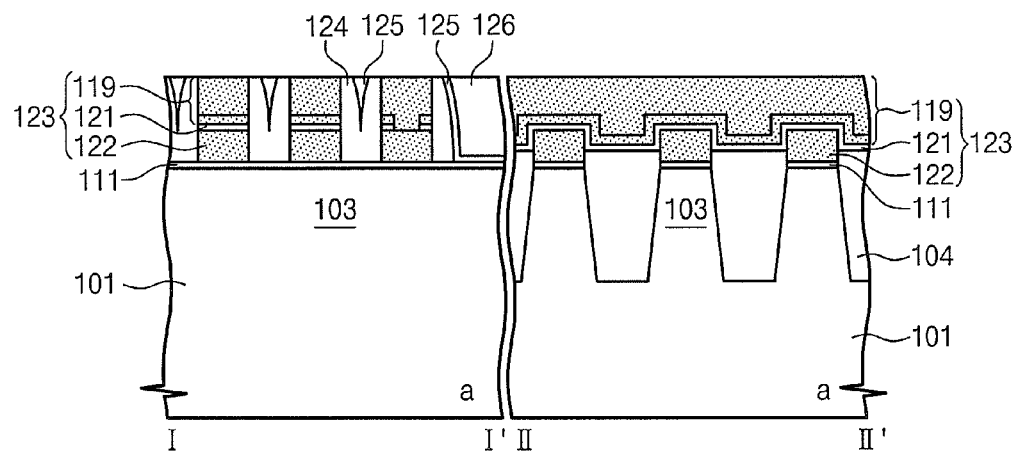
Figure 11B:
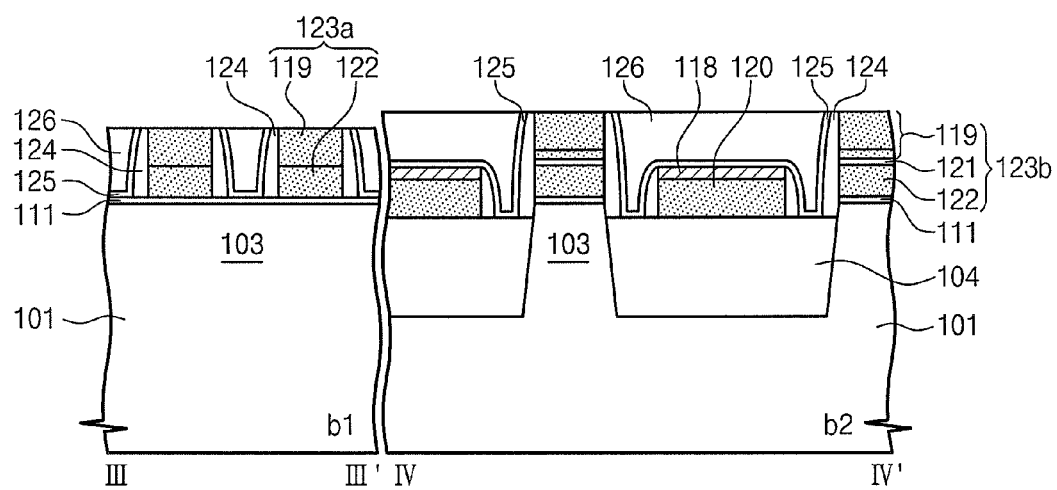

Referring to FIGS. 11A and 11B, the semiconductor device is prepared according to process steps shown and described above in connection with FIGS. 7A and 7B. Following this, the process steps shown and described above in connection with FIGS. 8A and 8B are performed. In particular, referring to FIGS. 11A and 11B, upper portions of the preliminary gate patterns 123, 123a, 123b are removed using conventional planarization processes such as CMP or blanket etch. During this process, portions of the etch stop layer 125 are removed to expose the underlying mask patterns 118 at top regions of the preliminary gate patters 123, 123a, 123b. The mask patterns 118 are also removed to expose the conductive second gate electrode layers 119 of the preliminary gate patterns 123, 123a, 123b. In this embodiment, however, upper portions of the insulating layer 126 and gate spacers 124 are not removed, or are marginally removed, as a result of the removal process. As in the above-described embodiment, during this operation, it can be seen that the top surfaces of the isolation structures 104 are recessed relative to the upper surface of the substrate 101 so that the top surfaces of the isolation structures 104 are lower in height that a top surface of the substrate 101, for example a top surface of the active regions 103 of the substrate 101. Accordingly, the resistor pattern 120 lies embedded under a body of the insulating layer 126 in the recess between the dummy preliminary gate patterns 123b, since, as described above, a top portion of the resistor pattern 120 lies at a height above the substrate 101 that is less than a height of the neighboring dummy preliminary gate patterns 123b. The insulating layer 126 thus operates to protect the resistor pattern 120 from any planarization or material removal during this step, since the resistor pattern 120 lies below the insulating layer 126. Thus, resistivity of the resistor pattern 120 is not changed as a result of the removal process for exposing upper portions of the conductive second gate electrode layers 119 of the preliminary gate patterns 123, 123a, 123b.

Figure 12A:
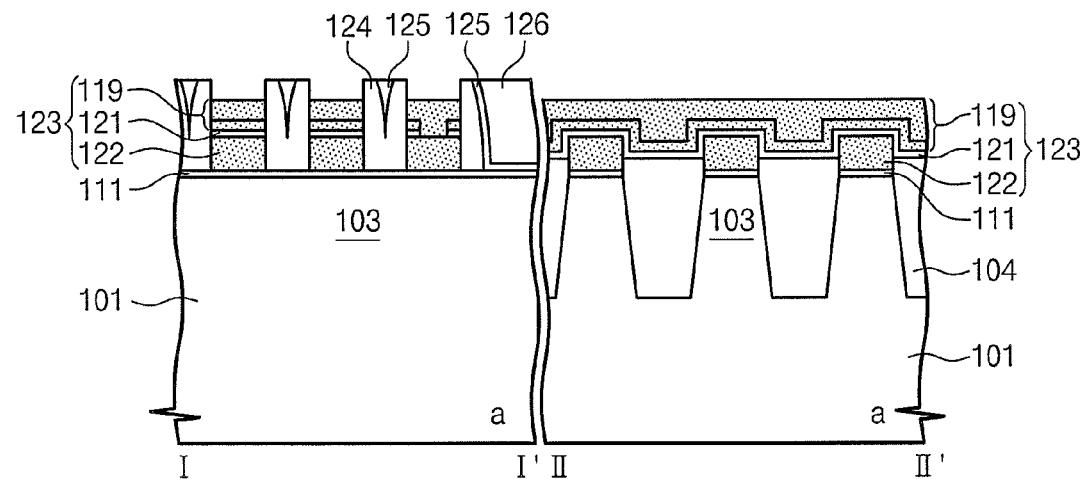
Figure 12B:
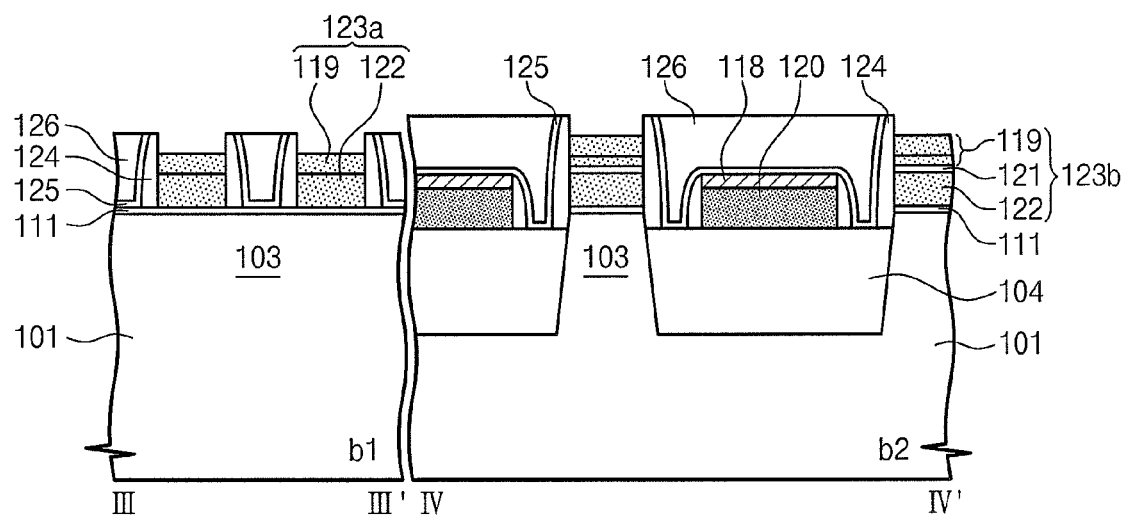

Referring to FIGS. 12A and 12B, upper portions of the second gate electrode layers 119 of the preliminary gate patterns are selectively and partially removed. In an example where the second gate electrode layers 119 comprise polysilicon, a wet etchant or a dry etchant can be used for this process step. Again, during this step, top surfaces of the isolation structures 104 are recessed relative to the upper surface of the substrate 101 so that the top surfaces of the isolation structures 104 are lower in height that a top surface of the substrate 101, for example a top surface of the active regions 103 of the substrate 101. Accordingly, a top portion of the resistor pattern 120 lies at a height above the substrate 101 that is less than a height of the neighboring dummy preliminary gate patterns 123b, the insulating layer 126 operates to protect the resistor pattern 120 from any material removal during this step. Thus the resistivity of the resistor pattern 120 is not changed as a result of this step.

Figure 13A:
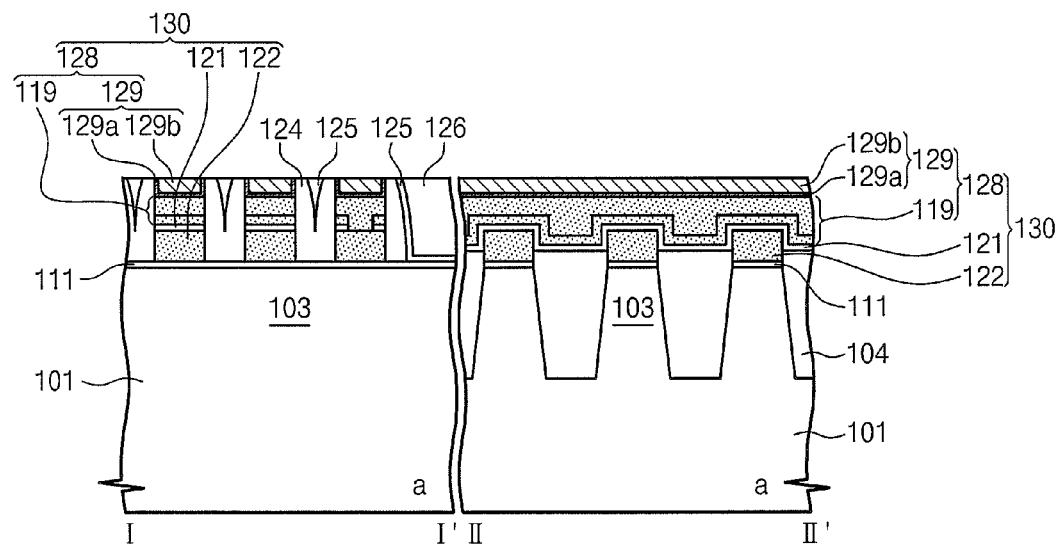
Figure 13B:
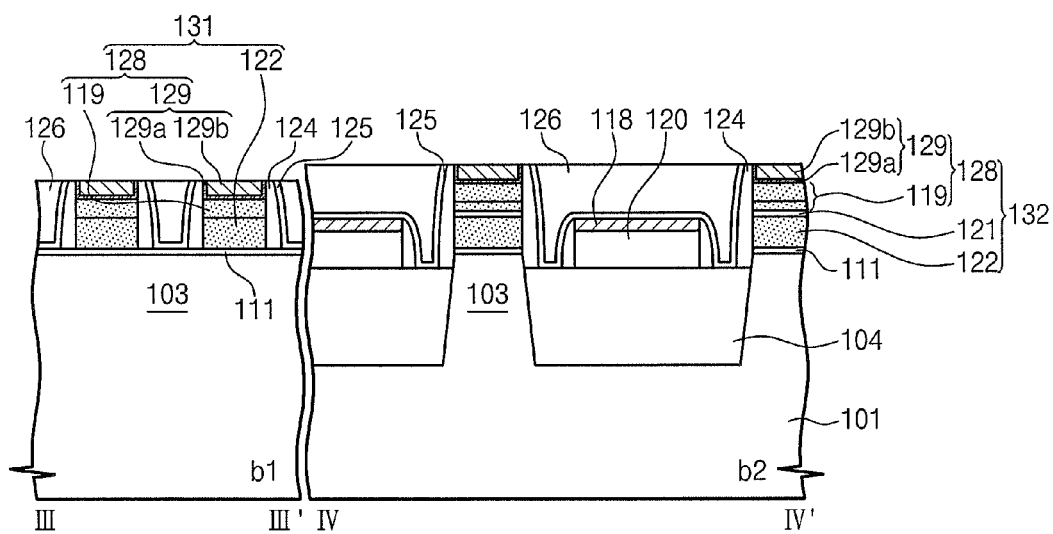

Referring to FIGS. 13A and 13B, a metal gate pattern 129 is applied to the resulting structure, using a damascene process. An optional barrier metal layer 129a comprising, for example, TiN, TaN, or WN, is applied to coat a top and sidewalls of the openings formed as a result of partial removal of the second gate electrode layers 119 during the preceding step. A metal layer 129b for example comprising W, Cu, or Al, is then applied to the resulting structure, to fill the openings. The metal layer 129b and barrier layer 129a are then planarized according to conventional processes. Again, during this step, top surfaces of the isolation structures 104 are recessed relative to the upper surface of the substrate 101 so that the top surfaces of the isolation structures 104 are lower in height that a top surface of the substrate 101, for example a top surface of the active regions 103 of the substrate 101. Accordingly, a top portion of the resistor pattern 120 lies at a height above the substrate 101 that is less than a height of the resulting neighboring peripheral gate patterns 131, 132, the insulating layer 126 operates to protect the resistor pattern 120 from any modification during this step. Thus the resistivity of the resistor pattern 120 is not changed as a result of this step.

Following this, further fabrication processes on the resulting device are performed, for example, according to the processes shown and described above in connection with FIGS. 10A and 10B.

FIGS. 14A-19A are cross-sectional views of the formation of a cell region of the semiconductor device of FIG. 1, taken along section lines I-I' and II-II' in accordance with another embodiment of the present invention. FIGS. 14B-19B are cross-sectional views of the formation of a peripheral region of the semiconductor device of FIG. 1, taken along section lines III-III' and IV-IV' in accordance with another embodiment of the present invention. In this embodiment, a different sequence of steps is performed for fabrication of the structure.

Figure 14A:
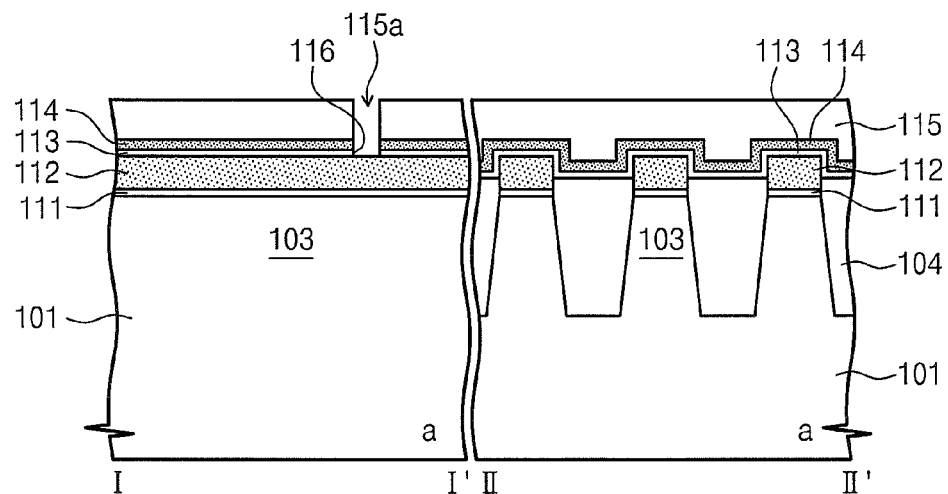
Figure 14B:
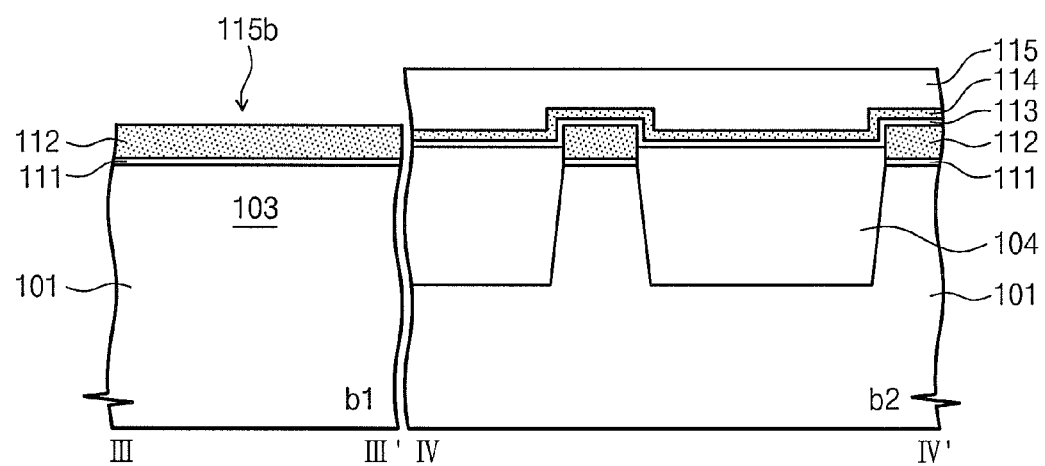

Referring to FIGS. 14A and 14B, the semiconductor device is prepared according to process steps shown and described above in connection with FIGS. 3A and 3B. Referring to FIGS. 14A and 14B, a mask layer 115 is provided over the resulting structure, and the mask layer is patterned to form first openings 115a and second openings 115b that expose the underlying first gate electrode layer 114. During this operation, the mask layer 115 is patterned to cover the resistor region b2 of the device. The exposed portions of the first gate electrode layer 114 and the underlying blocking insulating layer 113 are etched.

In the first openings 115a, the underlying charge storage layer 112 is exposed by the etching process to provide a butting contact region 116 of selection gates of the cell region a to be formed. In the second openings 115b, the underlying charge storage layer 112 is exposed as a result of the etching process. In this embodiment, the isolation structures 104 in the resistor region b2 of the peripheral region b are not recessed contemporaneously with, or during the same process step as, removal of the blocking insulating layer 113 for certain transistor gates in the cell region a, since the isolation structures 104 remain covered by the mask layer 115.

Figure 15A:
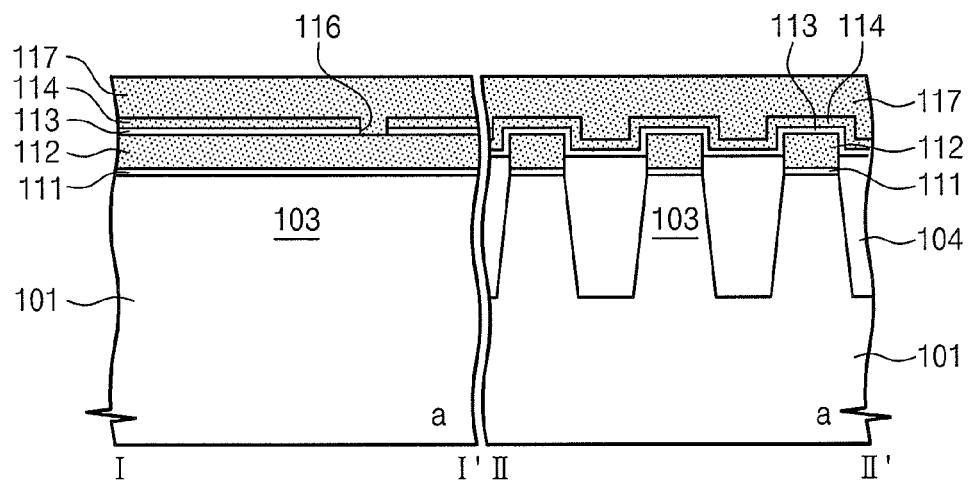
Figure 15B:
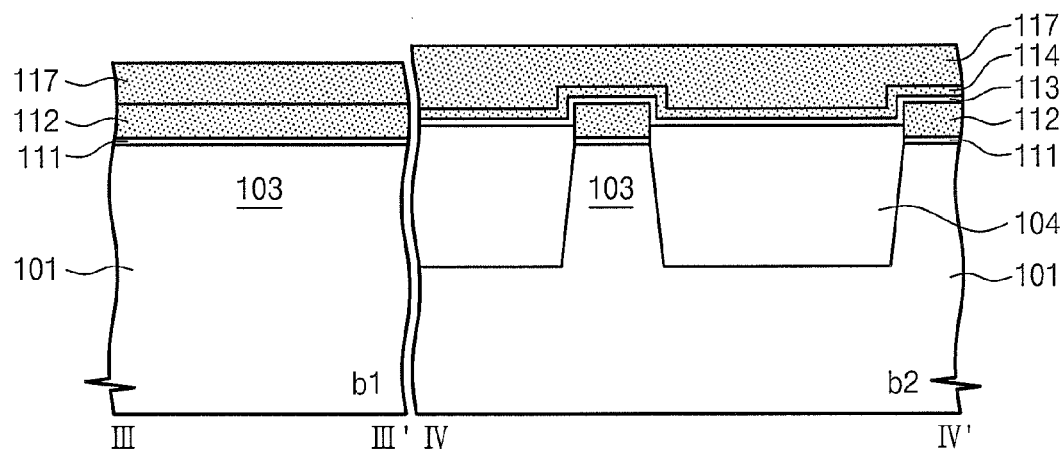

Referring to FIGS. 15A and 15B, the mask layer 115 is removed, and a second gate electrode layer 117 is applied to the resulting structure. In the butting contact region 116 of the cell region a, the second gate electrode layer 117 is in contact with the underlying charge storage layer 112. Since the underlying charge storage layer 112 can be formed of an insulative material, the role of the butting contact region 116 is not necessarily to make electrical contact between the second gate electrode layer 117 and the underlying charge storage layer 112, but rather to bring the lower portion of the second gate electrode layer 117 in the butting contact region 116 into a lower position so as to be coupled with the active region lying below the underlying tunnel insulating layer 111 below the butting region. In this manner, the resulting transistor to be formed in the butting region will operate as a conventional transistor. In the circuit region b1 of the peripheral region b, the second gate electrode layer 117 lies directly on the charge storage layer 112. In the resistor region b2 of the peripheral region b, the second gate electrode layer 117 lies on the isolation structures 104.

Figure 16A:
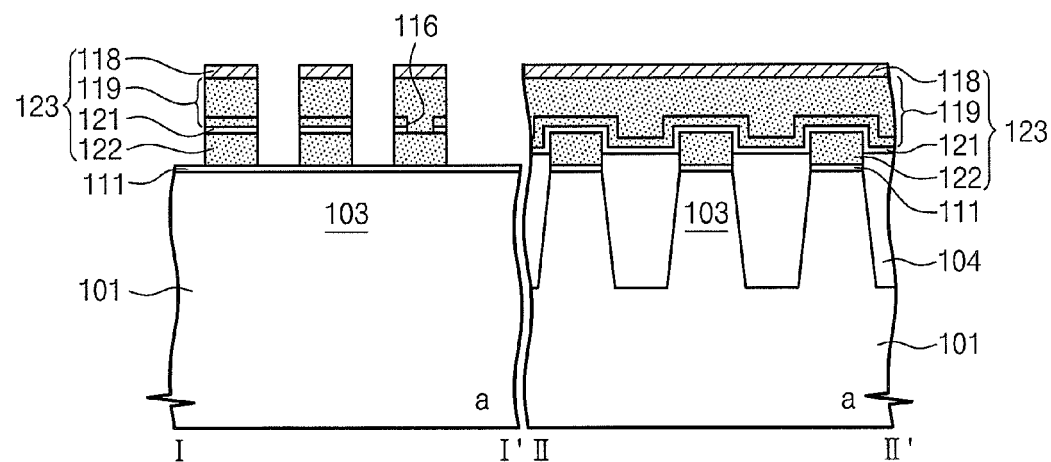
Figure 16B:
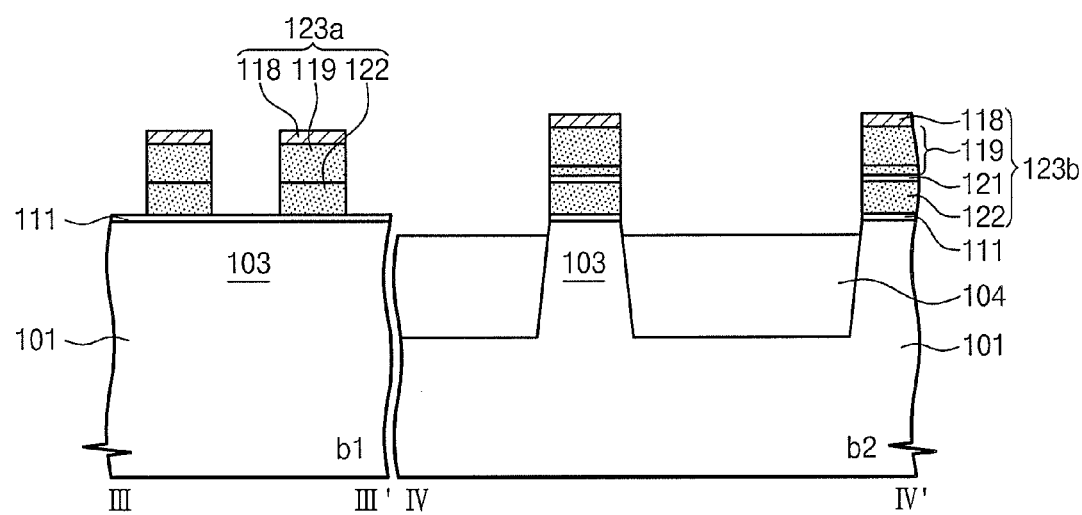

Referring to FIGS. 16A and 16B, the resulting structure is patterned using conventional patterning techniques to form preliminary gate patterns 123, 123a, 123b in the cell region a and in the peripheral region b of the device. In one embodiment, the preliminary gate patterns 123 are patterned using a mask pattern 118 that is applied to the structure. During the etching of the preliminary gate patterns 123 in the cell region a and the circuit region b1 of the peripheral region b, the tunnel insulating layer 111 operates as an etch stop.

The preliminary gate patterns 123 in the cell region a comprise the tunnel insulating layer 111, the patterned charge storing layer 122, the patterned blocking insulating layer 121, the patterned first and second gate electrode layers 119, and the mask pattern 118. The patterned first and second gate electrode layers 119 are operable as a control gate and the patterned charge storage layer 122 is operable as a floating gate for the floating gate transistors of the cell region a.

The preliminary gate patterns 123a in the circuit region b1 of the peripheral region b comprise the tunnel insulating layer 111, the patterned charge storing layer 122, the patterned second gate electrode layer 119, and the mask pattern 118. The patterned first and second gate electrode layers 119 are operable as a conventional gate for the conventional transistors of the circuit region b1 of the peripheral region b.

The preliminary gate patterns 123b in the resistor region b2 of the peripheral region b comprise the tunnel insulating layer 111, the patterned charge storing layer 122, the patterned blocking insulating layer 121, the patterned first and second gate electrode layers 119, and the mask pattern 118. The preliminary gate patterns 123b in the resistor region b2 are formed between the resistor patterns 120 in the active regions 103 between the isolation structures 104, and need not function as operable gates for the device, and therefore can be referred to as "dummy gate patterns", in certain applications of the embodiments of the present invention.

During this operation, the tunnel insulating layer 111 is not present on the isolation structures 104 in the resistor region b2 of the peripheral region b, so the tunnel insulating layer 111 does not serve as an etch stop for these structures. As a result, the upper surfaces of the isolation structures 104 are etched during this step, so as to recess the isolation structures 104 in the resistor regions b2 of the peripheral region b. In this manner, the isolation structures 104 in the resistor region b2 of the peripheral region b can be recessed contemporaneously with, or during the same process step as, patterning of the preliminary gate patterns 123, in the cell region a and preliminary gate patterns 123a, 123b in the peripheral region b. As a result, top, or upper, surfaces of the isolation structures 104 are recessed relative to the upper surface of the substrate 101 so that the top surfaces of the isolation structures 104 are lower in height that a top surface of the substrate 101, for example a top surface of the active regions 103 of the substrate 101.

Figure 17A:
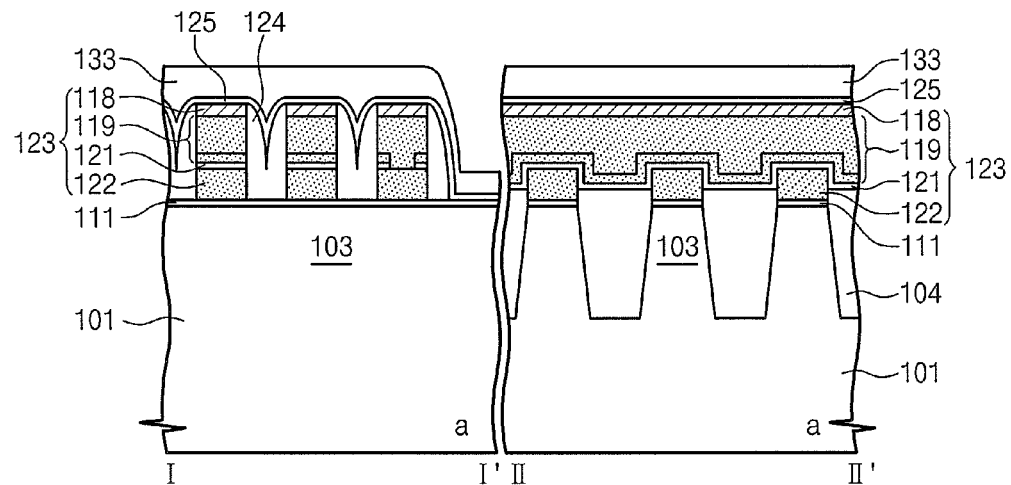
Figure 17B:
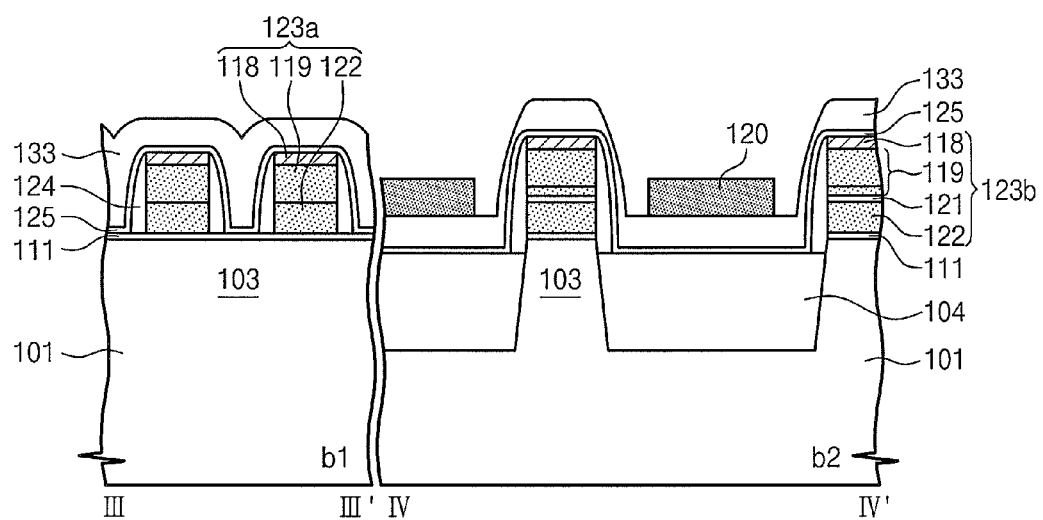

Referring to FIGS. 17A and 17B, gate spacers 124 are then formed at sidewalls of the preliminary gate patterns 123, 123a, 123b according to conventional fabrication techniques using an insulative layer, for example, comprising $SiO_2$, SiN or SION. An etch stop layer 125, for example comprising SiN, is then applied to the resulting structure, including the gate spacers, according to conventional fabrication techniques. The etch stop layer 125 should be formed of a material having etch selectivity with respect to the subsequently formed interlayer dielectric layer 126.

A gap-filling insulating layer 133 is then applied to the resulting structure so as to fill any remaining gaps between neighboring preliminary gate patterns 123, 123a in the cell region a and in the circuit region b1 of the peripheral region b. The gap-filling insulating layer 133 operates to prevent the subsequently applied resistor material layer 120 from entering the gaps, thereby avoiding any shorting problems that can otherwise occur. Application of the gap-filling insulating layer 133 is optional.

A resistor material layer, for example comprising polysilicon, is then applied to the resulting structure, and is patterned to form resistor patterns 120 in the recess regions on the isolation structures 104 and on the gap-filling insulating layer 133 in the resistor region b2 of the peripheral region b. The resistor patterns 120 are doped according to conventional fabrication procedures so that the polysilicon is made to be conductive. Comparing the present embodiment to the above-described embodiments of FIGS. 2-13, in the present embodiment, the resistor patterns 120 are formed from a material layer that is different than the material layer that is used to form the second electrode layer 119. Therefore, although the present embodiment requires additional process steps, it is especially attractive for situations where control of the resistivity of the resulting resistor pattern is desired independent of the conductivity, material type and thickness of the electrode 119 of the cell gate patterns 123.

Figure 18A:
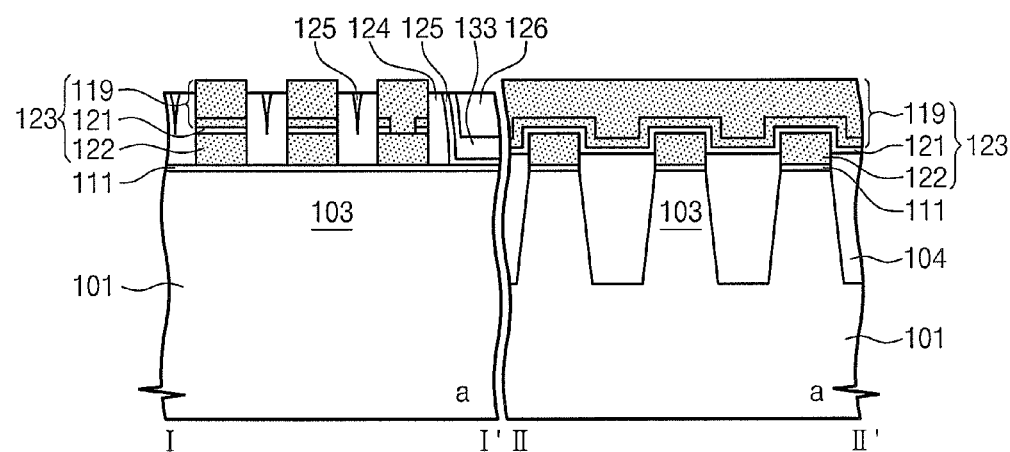
Figure 18B:
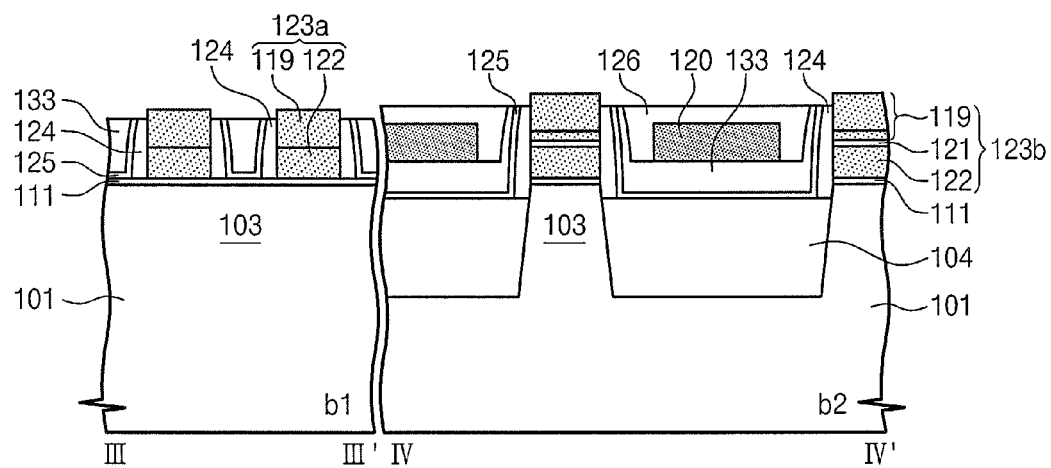

Referring to FIGS. 18A and 18B, an insulating layer 126 is applied to the resulting structure. In one example embodiment, the insulating layer 126 comprises SiO$_2$, a low-k material or a combination thereof, formed according to conventional fabrication techniques. The applied insulating layer 126 fills any remaining space between the preliminary gate patterns 123, 123a in the cell region a and in the circuit region b1 of the peripheral region b, and fills the space between the preliminary dummy gate patterns in the resistor region b2 of the peripheral region b on the resistor patterns 120. An upper portion of the insulating layer 126 is then removed, or planarized, to expose the upper surfaces of the preliminary gate patterns 123, 123a and preliminary dummy gate patterns 123b using the etch stop layer 125 as an etch stop.

Upper portions of the preliminary gate patterns 123, 123a, 123b are removed using conventional planarization processes such as CMP or blanket etch. During this process, portions of the etch stop layer 125 are removed to expose the underlying mask patterns 118 at top regions of the preliminary gate patters 123, 123a, 123b. The mask patterns 118 are also removed to expose the conductive second gate electrode layers 119 of the preliminary gate patterns 123, 123a, 123b. At the same time, upper portions of the insulating layer 126 and gate spacers 124 are removed as a result of the removal process. During this operation, it can be seen that top surfaces of the isolation structures 104 are recessed relative to the upper surface of the substrate 101 so that the top surfaces of the isolation structures 104 are lower in height that a top surface of the substrate 101, for example a top surface of the active regions 103 of the substrate 101. Accordingly, the resulting resistor pattern 120 lies embedded under a body of the insulating layer 126 in the recess between the dummy preliminary gate patterns 123b, since, as described above, a top portion of the resistor pattern 120 lies at a height above the substrate 101 that is less than a height of the neighboring dummy preliminary gate patterns 123b or less than a height of the preliminary gate patterns 123a in the circuit region b2 of the peripheral region b. The insulating layer 126 thus operates to protect the resistor pattern 120 from any planarization or material removal during this step, since the resistor pattern 120 lies below the insulating layer 126. Thus, resistivity of the resistor pattern 120 is not changed as a result of the removal process for exposing upper portions of the conductive second gate electrode layers 119 of the preliminary gate patterns 123, 123a, 123b.

Figure 19A:
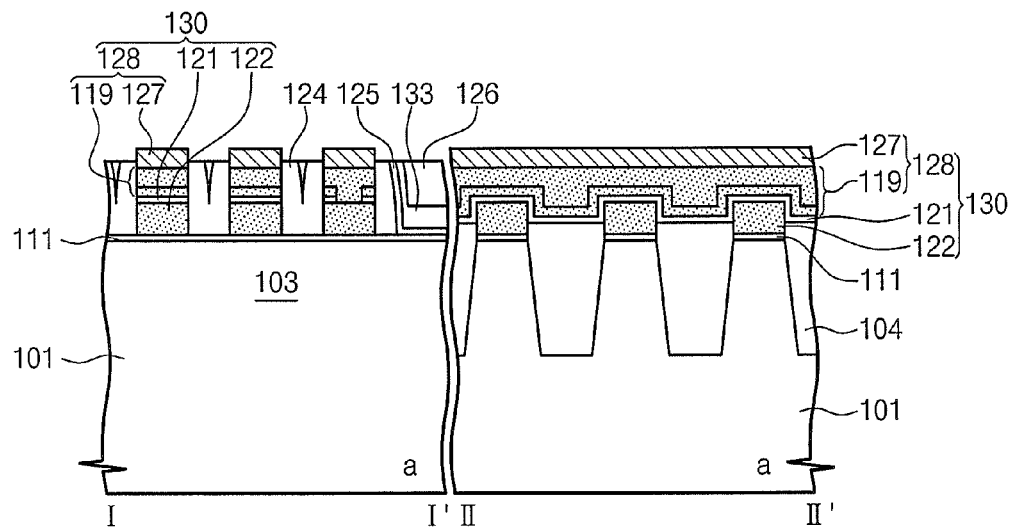
Figure 19B:
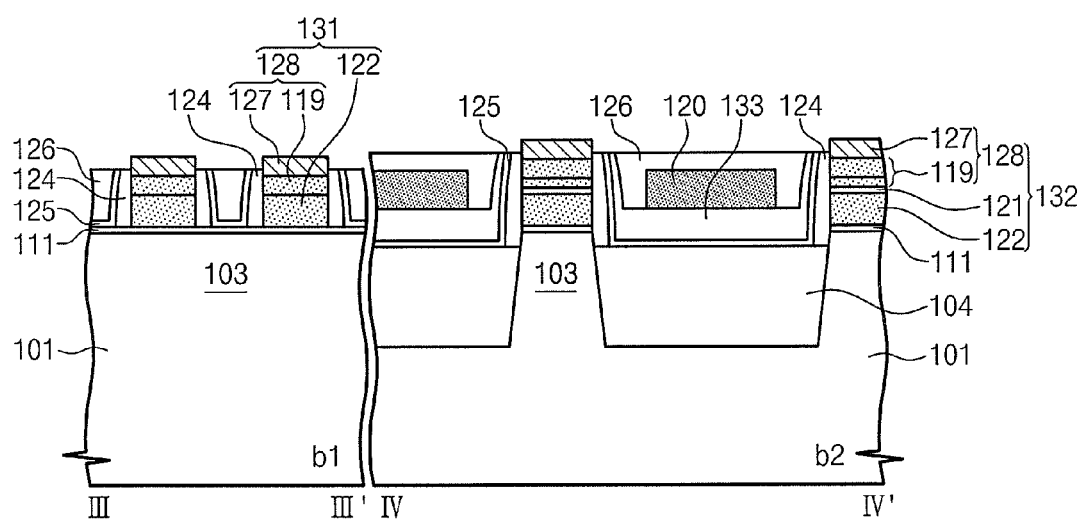

Referring to FIGS. 19A and 19B, a silicidation process is next performed to form a silicide layer 127 at top portions of the second gate electrode layer 127 of the preliminary gate patterns to reduce contact resistance at the top portions thereof. As a result, a cell region gate pattern 130 in the cell region a comprises a control gate 128 including the first and second gate electrode layers 119 and the silicide layer 127, a blocking insulating layer 121, a floating gate formed from the patterned charge storage layer 122, and a tunnel insulating layer 111. Also, a circuit region gate pattern 131 in the circuit region b1 of the peripheral region b is a conventional transistor gate pattern, and includes a conductive gate 128 including the second gate electrode layer 119 and the silicide layer 127. The underlying patterned charge storage layer 122 and the tunnel insulating layer 111 in combination operate as a gate insulating layer for the circuit region gate pattern 131. In addition, the resulting resistor region dummy gate pattern 132 in the resistor region b2 of the peripheral region b of the device includes a dummy control gate 128 including the first and second gate electrode layers 119 and the silicide layer 127, a blocking insulating layer 121, a dummy floating gate formed from the patterned charge storage layer 122, and a tunnel insulating layer 111.

During the silicidation process, the resistor pattern is covered by the body of the insulating layer 126 in the recess between the dummy gate patterns 132, since, as described above, the top surfaces of the isolation structures 104 are lower in height that a top surface of the substrate 101, for example a top surface of the active regions 103 of the substrate 101, and accordingly, a top portion of the resistor pattern 120 lies at a height above the substrate 101 that is less than a height of the neighboring dummy gate patterns 132 or the neighboring circuit gate patterns 131 of the circuit region b1 of the peripheral region b. The insulating layer 126 thus operates to protect the resistor pattern 120 from any silicidation during this step, since the resistor pattern 120 lies below the insulating layer 126. Thus, resistivity of the resistor pattern 120 is not changed as a result of the silicidation process.

FIGS. 20A-22A are cross-sectional views of the formation of a cell region of the semiconductor device of FIG. 1, taken along section lines I-I' and II-II' in accordance with another embodiment of the present invention. FIGS. 20B-22B are cross-sectional views of the formation of a peripheral region of the semiconductor device of FIG. 1, taken along section lines III-III' and IV-IV' in accordance with another embodiment of the present invention. In this embodiment, no silicidation of the upper portions of the electrodes of the preliminary gate patterns 121, 122, 123 takes place. Instead, a metal layer is applied to the upper portions of the electrodes.

Figure 20A:
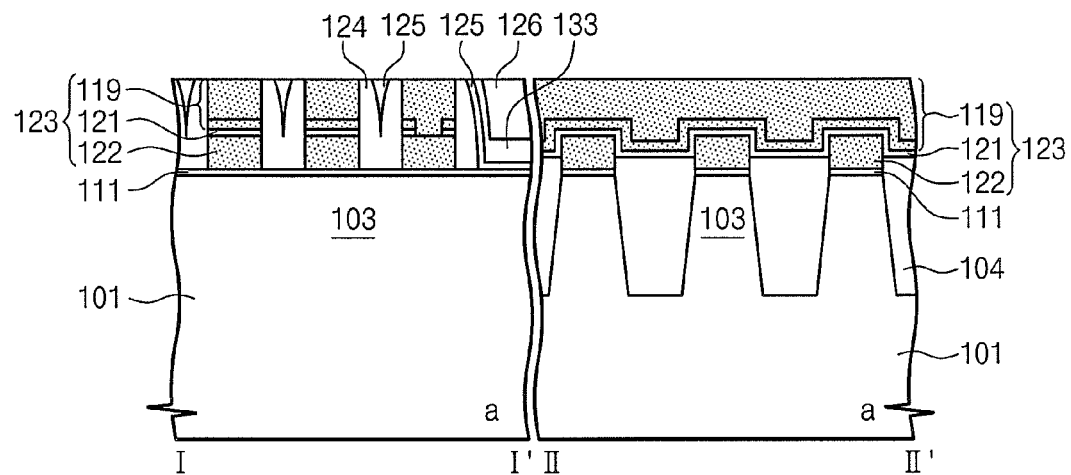
Figure 20B:
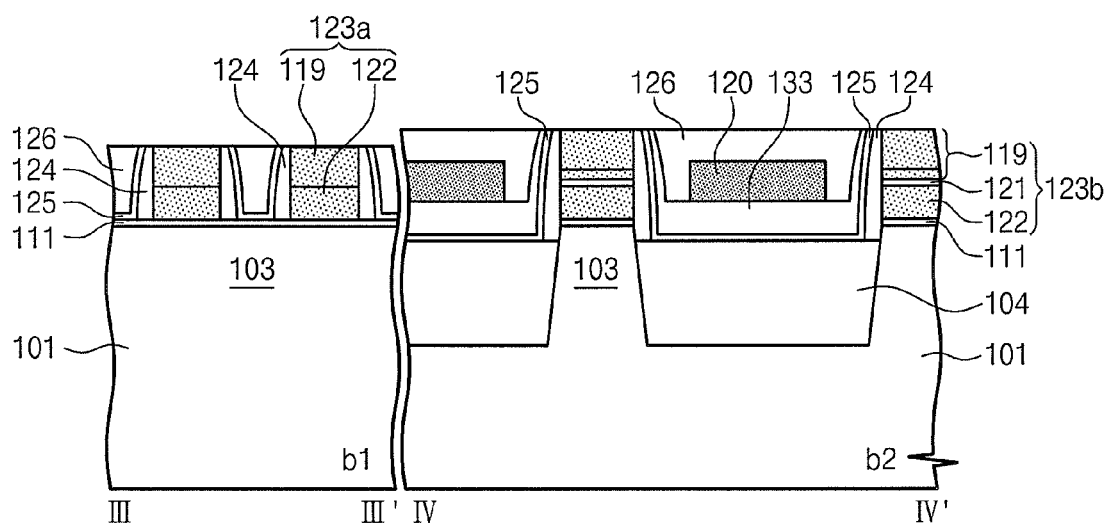

Referring to FIGS. 20A and 20B, the semiconductor device is prepared according to process steps shown and described above in connection with FIGS. 17A and 17B. Following this, the process steps shown and described above in connection with FIGS. 18A and 18B are performed. In particular, referring to FIGS. 20A and 20B, upper portions of the preliminary gate patterns 123, 123a, 123b are removed using conventional planarization processes such as CMP or blanket etch. During this process, portions of the etch stop layer 125 are removed to expose the underlying mask patterns 118 at top regions of the preliminary gate patters 123, 123a, 123b. The mask patterns 118 are also removed to expose the conductive second gate electrode layers 119 of the preliminary gate patterns 123, 123a, 123b. In this embodiment, however, upper portions of the insulating layer 126 and gate spacers 124 are not removed, or are marginally removed, as a result of the removal process. As in the above-described embodiment of FIGS. 14-19, during this operation, it can be seen that the resistor pattern 120 lies embedded under a body of the insulating layer 126 in the recess between the dummy preliminary gate patterns 123b, since, as described above, the top surfaces of the isolation structures 104 of the resistor region b2 of the peripheral region b are lower in height that a top surface of the substrate 101, for example a top surface of the active regions 103 of the substrate 101. The insulating layer 126 thus operates to protect the resistor pattern 120 from any planarization or material removal during this step, since the resistor pattern 120 lies below the insulating layer 126. Thus, resistivity of the resistor pattern 120 is not changed as a result of the removal process for exposing upper portions of the conductive second gate electrode layers 119 of the preliminary gate patterns 123, 123a, 123b.

Figure 21A:
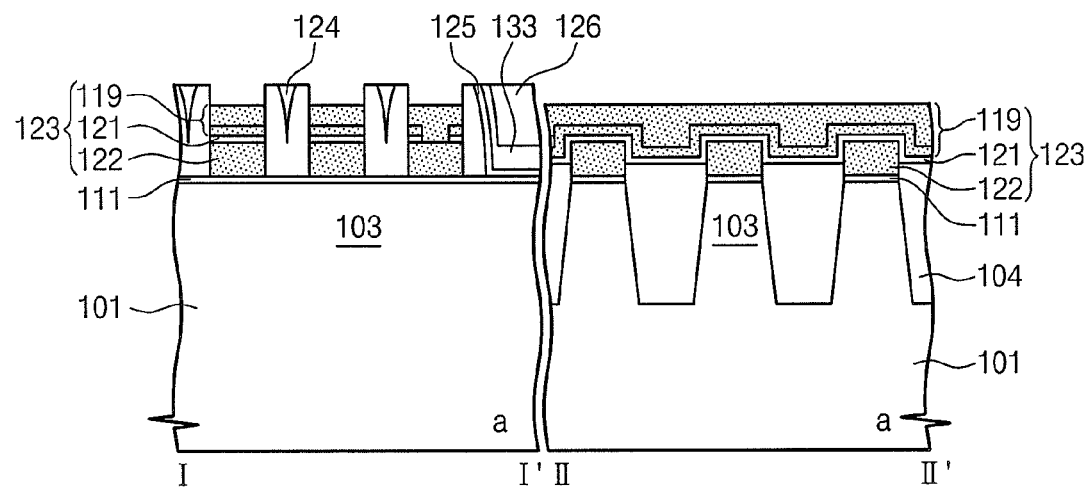
Figure 21B:
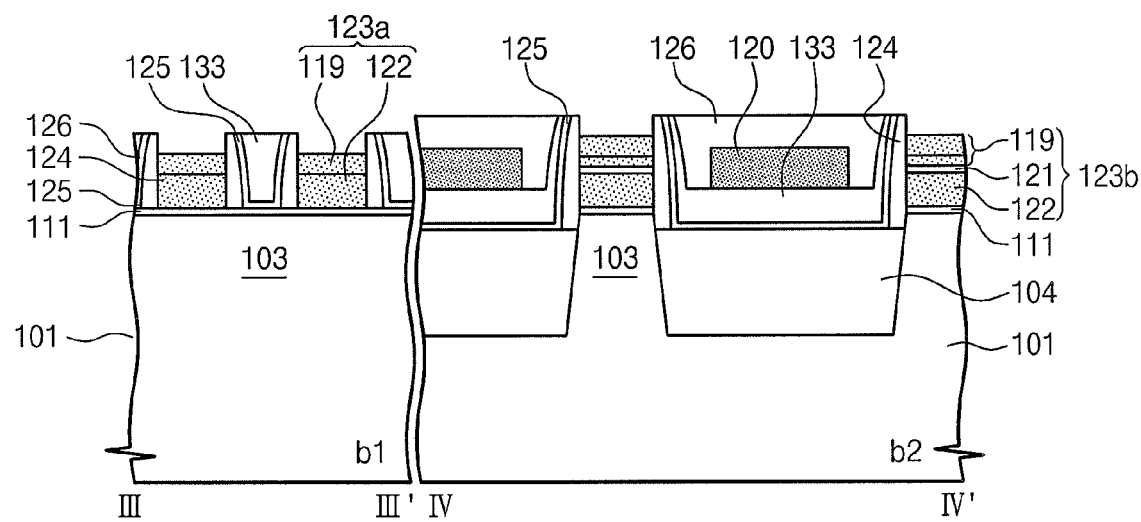

Referring to FIGS. 21A and 21B, upper portions of the second gate electrode layers 119 of the preliminary gate patterns 123, 123a, 123b are selectively and partially removed. In an example where the second gate electrode layers 119 comprise polysilicon, a wet etchant or a dry etchant can be used for this process step. Again, during this step, since the top surfaces of the isolation structures 104 are lower in height that a top surface of the substrate 101, for example a top surface of the active regions 103 of the substrate 101, a top portion of the resistor pattern 120 lies at a height above the substrate 101 that is less than a height of the neighboring dummy preliminary gate patterns 123b, and the insulating layer 126 thus operates to protect the resistor pattern 120 from any material removal during this step. Thus the resistivity of the resistor pattern 120 is not changed as a result of this step.

Figure 22A:
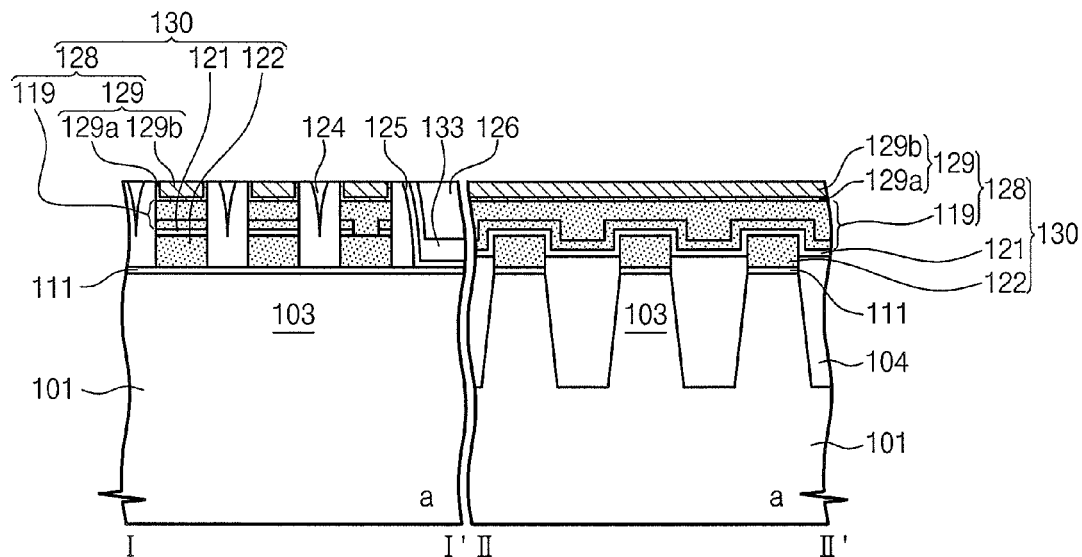
Figure 22B:
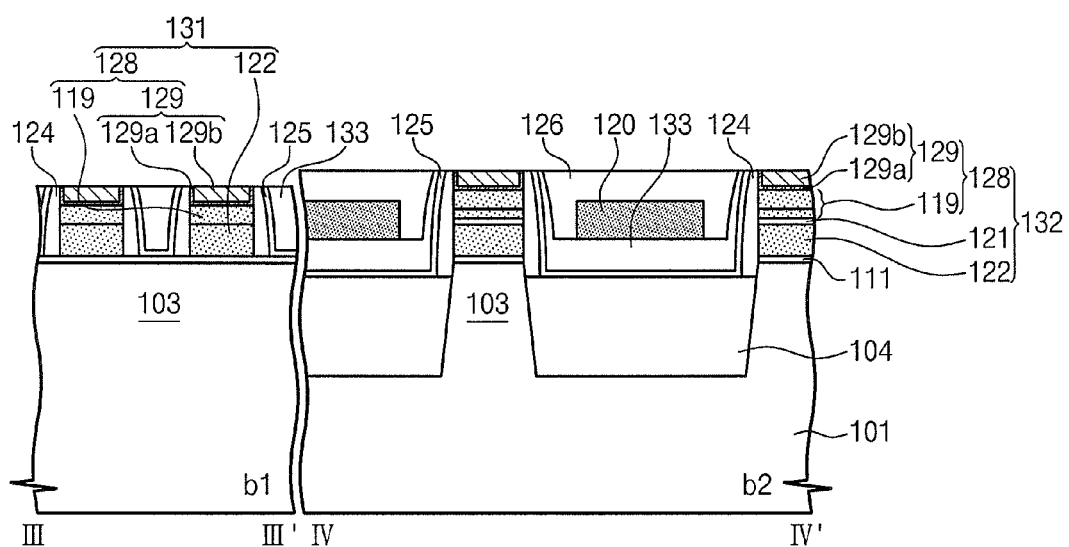

Referring to FIGS. 22A and 22B, a metal gate pattern 129 is applied to the resulting structure, using a damascene process. An optional barrier metal layer 129a comprising, for example, TiN, TaN, or WN, is applied to coat a top and sidewalls of the openings formed as a result of partial removal of the second gate electrode layers 119 during the preceding step. A metal layer 129b for example comprising W, Cu, or Al, is then applied to the resulting structure, to fill the openings. The metal layer 129b and barrier layer 129a are then planarized according to conventional processes. Again, during this step, since the top surfaces of the isolation structures 104 are lower in height that a top surface of the substrate 101, for example a top surface of the active regions 103 of the substrate 101, a top portion of the resistor pattern 120 lies at a height above the substrate 101 that is less than a height of the resulting neighboring peripheral gate patterns 131, 132, and the insulating layer 126 thus operates to protect the resistor pattern 120 from any modification during this step. Thus the resistivity of the resistor pattern 120 is not changed as a result of this step.

Following this, further fabrication processes on the resulting device are performed, for example, according to the processes shown and described above in connection with FIGS. 10A and 10B.

Figure 23:
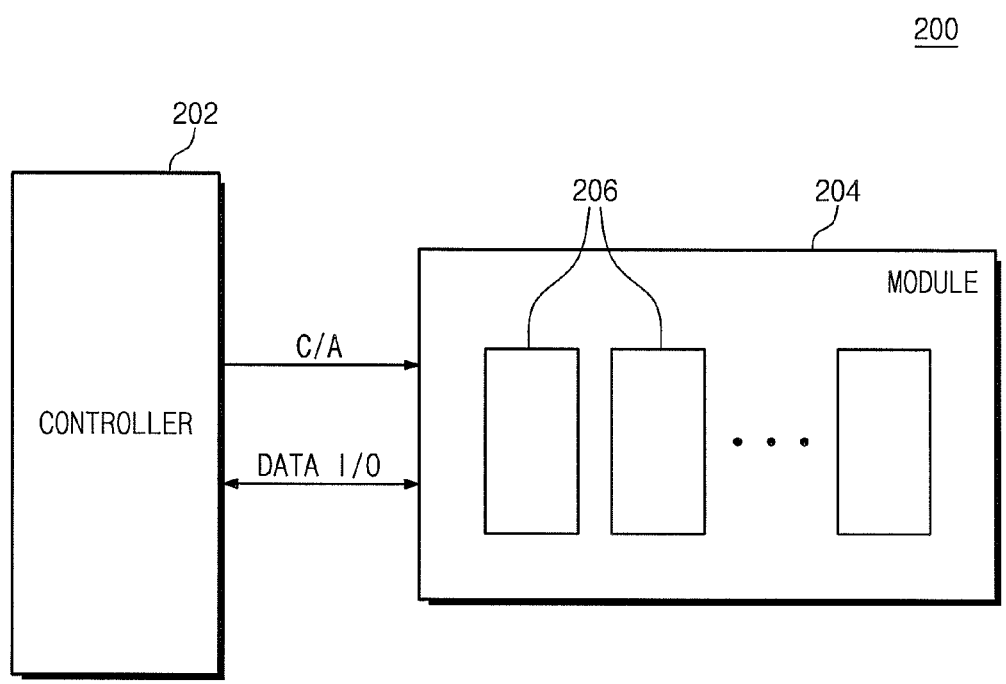
FIG. 23 is a block diagram of a memory system that includes a semiconductor device in accordance with the embodiments of the present invention.

FIG. 23 is a block diagram of a memory system that includes a semiconductor device in accordance with the embodiments of the present invention. The memory system 200 includes a memory controller 202 that generates command and address signals C/A and a memory module 204 that includes a plurality of memory devices 206. The memory module 204 receives the command and address signals C/A from the memory controller, and, in response stores and retrieving data DATA I/O to and from at least one of the memory devices 206. Each memory device includes a plurality of addressable memory cells and a decoder that receives the receives the command and address signals, and that generates a row signal and a column signal for accessing at least one of the addressable memory cells during programming and read operations. Each of the components of the memory system 200, including the controller 202, the module electronics 204, and the memory devices 206 can employ the resistor pattern configurations disclosed herein.

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
    a substrate including a first region and a second region;
    at least one first gate structure on the substrate in the first region, the at least one first gate structure including a tunnel insulating layer, a charge storage layer on the tunnel insulating layer, a first gate electrode layer on the charge storage layer and a second gate electrode layer on the first gate electrode layer;
    at least one isolating layer in the substrate in the second region; and
    at least one resistor pattern on the at least one isolating layer,
    wherein a bottom surface of the at least one resistor pattern is lower in height than a top surface of the substrate,
    and wherein the at least one first gate structure further includes a silicide region at a top portion thereof, and wherein the topmost surface of the at least one resistor pattern is lower in height than the bottom surface of the silicide region.

2. The semiconductor device of claim 1 wherein the second gate electrode layer includes a material layer and the at least one resistor pattern includes the material layer.

3. The semiconductor device of claim 1 wherein the first region comprises a cell region of the device, wherein the at least one first gate structure comprises at least one cell gate structure, and wherein the second region comprises a peripheral region of the device.

4. The semiconductor device of claim 1 wherein the at least one first gate structure comprises multiple first gate structures and wherein in a subset of the multiple first gate structure, the first gate electrode layer and the charge storage layer are in direct electrical contact.

5. The semiconductor device of claim 1 wherein no silicide region is present on the at least one resistor pattern.

6. The semiconductor device of claim 1 wherein the at least one first gate structure further includes a metal layer.

7. The semiconductor device of claim 6 wherein no metal layer is present on the at least one resistor pattern.

8. A semiconductor device comprising:
    a substrate including a first region and a second region;
    at least one first gate structure on the substrate in the first region, the at least one first gate structure including a tunnel insulating layer, a charge storage layer on the tunnel insulating layer, a first gate electrode layer on the charge storage layer and a second gate electrode layer on the first gate electrode layer;
    at least one isolating layer in the substrate in the second region; and
    at least one resistor pattern on the at least one isolating layer,
    wherein the at least one first gate structure further includes a silicide region, and
    wherein the topmost surface of the at least one resistor pattern is lower in height than the top surface of the second gate electrode layer.

9. The semiconductor device of claim 8 wherein a top surface of the substrate is lower than the top surface of the at least one resistor pattern and higher than a bottom surface of the at least one resistor pattern.

10. The semiconductor device of claim 8 wherein the second gate electrode layer includes material layer and the at least one resistor pattern includes the material layer.

11. The semiconductor device of claim 8 wherein the first region comprises a cell region of the device, wherein the at least one first gate structure comprises at least one cell gate structure, and wherein the second region comprises a peripheral region of the device.

12. The semiconductor device of claim 8 wherein the at least one first gate structure comprises multiple first gate structures and wherein, in a subset of the multiple first gate structures, the first gate electrode layer and the charge storage layer are in direct electrical contact.

13. The semiconductor device of claim 8 wherein no silicide region is present on the at least one resistor pattern.

\* \* \* \* \*